(12) United States Patent
Fitelson et al.

(10) Patent No.: US 7,193,544 B1
(45) Date of Patent: Mar. 20, 2007

(54) PARALLEL, ADAPTIVE DELTA SIGMA ADC

(75) Inventors: Michael M. Fitelson, Columbia, MD (US); Aaron Pesetski, Gambrills, MD (US); Alfred P. Turley, Ellicott City, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 11/220,712

(22) Filed: Sep. 8, 2005

Related U.S. Application Data

(60) Provisional application No. 60/607,577, filed on Sep. 8, 2004.

(51) Int. Cl.
*H03M 3/00* (2006.01)

(52) U.S. Cl. ................................ 341/143; 341/155

(58) Field of Classification Search ............... 341/143, 341/144; 455/323
See application file for complete search history.

(56) References Cited

U.S. PATENT DOCUMENTS

| | | | | |
|---|---|---|---|---|
| 4,965,531 | A * | 10/1990 | Riley | 331/1 A |
| 5,196,852 | A | 3/1993 | Galton | |
| 5,345,236 | A * | 9/1994 | Sramek, Jr. | 341/144 |
| 5,729,230 | A * | 3/1998 | Jensen et al. | 341/143 |
| 6,057,791 | A * | 5/2000 | Knapp | 341/122 |
| 6,218,972 | B1 * | 4/2001 | Groshong | 341/143 |
| 6,515,553 | B1 * | 2/2003 | Filiol et al. | 332/127 |
| 7,061,989 | B2 * | 6/2006 | Bellaouar et al. | 375/295 |
| 2005/0118977 | A1 * | 6/2005 | Drogi et al. | 455/323 |

OTHER PUBLICATIONS

A Nyquist-Rate Delta-Sigma A/D Converter, Eric T. King et al., IEEE Journal of Solid-State Circuits, vol. 33, No. 1, Jan. 1998.
Oversampling Methods for A/D and D/A Conversion; James C. Candy et al.; In Oversampling Delta-Sigma Data Converters Theory, Design and Simulation; New York: IEEE Press, pp. 1-25, 1992.
A Monolithic 20-b Delta-Sigma A/D Converter, B.P. Signore et al., IEEE J. Solid-State Circuits, vol. 25, pp. 1311-1317, Dec. 1990.
Delta-Sigma Modulator Based A/D Conversion Without Oversampling, Galton et al., IEEE Transactions on Circuits and Systems—II:. Analog and Digital Signal Processing, vol. 42, No. 12, pp. 773-784, Dec. 1995.

(Continued)

*Primary Examiner*—Jean Bruner Jeanglaude
(74) *Attorney, Agent, or Firm*—Birch, Stewart, Kolasch & Birch, LLP

(57) ABSTRACT

An apparatus performs adaptive analog-to-digital conversion. The apparatus according to one embodiment comprises a frequency modulator unit for changing an input analog signal into a modulated analog signal with a frequency spectrum in a bandwidth of interest, a parallel delta sigma conversion unit operatively connected to the frequency modulator unit, the parallel delta sigma conversion unit converting the modulated analog signal into a digital signal, and a controller operatively connected to the frequency modulator unit and the parallel delta sigma conversion unit, the controller adjusting at least one parameter relating to a frequency characteristic of the frequency modulator unit and/or the parallel delta sigma conversion unit.

19 Claims, 19 Drawing Sheets

OTHER PUBLICATIONS

Time Interleaved Converter Arrays, W.C. Black, Jr., et al., IEEE Journal of Solid-State Circuits, vol. SC-15, No. 6,, pp. 1022-1029, Dec. 1980.

The Design of Sigma-Delta Modulation Analog-to-Digital Converters, B.E. Boser et al., IEEE Journal of Solid-State Circuits, vol. SC-23, No. 6, pp. 1298-1308, Dec. 1988.

Circuit and Technology Considerations For MOS Delta-Sigma A/D Converters, M.W. Hauser, et al., IEEE Proc. ISCAS, pp. 1310-1315, May 1986.

A Robust Parallel Delta-Sigma A/D Converter Architecture, H.T. Jensen et al., IEEE International Symposium on Circuits and Systems, pp. 1340-1344, May 1995.

Digital Comb Filter Implementation for the $\Pi\Delta\Sigma$ A/D Converter, S. Sculley et al., IEEE Proc. ISCAS, vol. 2, pp. 281-284, May 1996.

A 50-MHz Multibit Sigma-Delta Modulator for 12-b 2-MHz A/D Conversion, B.P. Brandt et al., IEEE Journal of Solid-State Circuits, vol. 26, No. 12, pp. 1746-1755, Dec. 1991.

* cited by examiner

PARALLEL, ADAPTIVE DELTA SIGMA ADC

PRIORITY CLAIMED

This application is a Non-Provisional application including the subject matter and claiming the priority date under 35 U.S.C. §119(e) of Provisional Application Ser. No. 60/607,577, filed Sep. 8, 2004, the contents of which are meant to be incorporated herein by reference.

BACKGROUND OF THE INVENTION

1. Field of the Invention

The present invention relates generally to analog-to-digital converters and control structures and methods for an analog-to-digital converter.

2. Description of the Related Art

Analog-to-digital (ADC) converters are essential components in today's electronic circuits and systems. ADC converters transform analog signals to digital signals. Conventional delta sigma ($\Delta\Sigma$) analog-to-digital converters offer high resolution and linearity, high integration, little differential non-linearity, and low cost. Their performance is not limited by mismatched components within the converter, and has low noise sensitivity. Most of the circuitry in delta sigma ADCs is digital; hence the performance of delta sigma ADCs does not drift with time and temperature.

Two basic principles govern the operation of conventional delta sigma ADCs: oversampling and noise shaping. The sampling frequency in a delta sigma ADC is typically chosen to be much larger than the input signal bandwidth. Oversampling spreads the quantization noise power over a bandwidth equal to the sampling frequency. A delta sigma ADC usually contains a delta sigma modulator, a lowpass filter, and a decimator filter. The delta sigma modulator applies a lowpass filter to the input analog signal and a high pass filter to the noise, hence placing most quantization noise energy above the input signal bandwidth. The lowpass filter follows the delta sigma modulator, attenuating out-of-band quantization noise. The decimator filter downsamples the sampled output digital signal to the Nyquist rate.

Since delta sigma ADCs typically operate at an oversampled rate much larger than the maximum input signal bandwidth, their circuitry is complex and their speed is low. Because of speed limitations, delta sigma ADCs perform best in high-resolution, very-low frequency applications.

In order to successfully extend the use of delta sigma ADCs to higher frequency applications, a parallel delta sigma ADC architecture has been proposed. U.S. Pat. No. 5,196,852 by Ian Galton and "A Nyquist-Rate Delta-Sigma A/D Converter" IEEE Journal of Solid-State Circuits, Vol. 33, No. 1, pp. 45–52 describe parallel delta sigma ADC systems. The system described in U.S. Pat. No. 5,196,852 achieves an effective oversampling ratio of N*M, where N is the oversampling ratio of each delta sigma ADC and M is the number of parallel delta sigma ADC channels. The system described in "A Nyquist-Rate Delta-Sigma A/D Converter" achieves an effective oversampling ratio of M without oversampling in the individual delta sigma ADCs, where M is the number of parallel delta sigma ADC channels. However, with the circuits described in above works, the parallel delta sigma ADCs do not self-adapt. Hence, only a limited predetermined range of incoming signal frequencies can be processed.

A disclosed embodiment of the application addresses these and other issues by utilizing a parallel, adaptive delta sigma analog-to-digital converter.

SUMMARY OF THE INVENTION

Embodiments of the present invention are directed to an apparatus for adaptive analog-to-digital conversion. According to a first aspect of the present invention, an apparatus for adaptive analog-to-digital conversion comprises: a frequency modulator unit for changing an input analog signal into a modulated analog signal with a frequency spectrum in a bandwidth of interest; a parallel delta sigma conversion unit operatively connected to the frequency modulator unit, the parallel delta sigma conversion unit converting the modulated analog signal into a digital signal; and a controller operatively connected to the frequency modulator unit and the parallel delta sigma conversion unit, the controller adjusting at least one parameter relating to a frequency characteristic of the frequency modulator unit and/or the parallel delta sigma conversion unit.

BRIEF DESCRIPTION OF THE DRAWINGS

Further aspects and advantages of the present invention will become apparent upon reading the following detailed description in conjunction with the accompanying drawings, in which.

DETAILED DESCRIPTION

Aspects of the invention are more specifically set forth in the accompanying description with reference to the appended figures.

Figure 1:
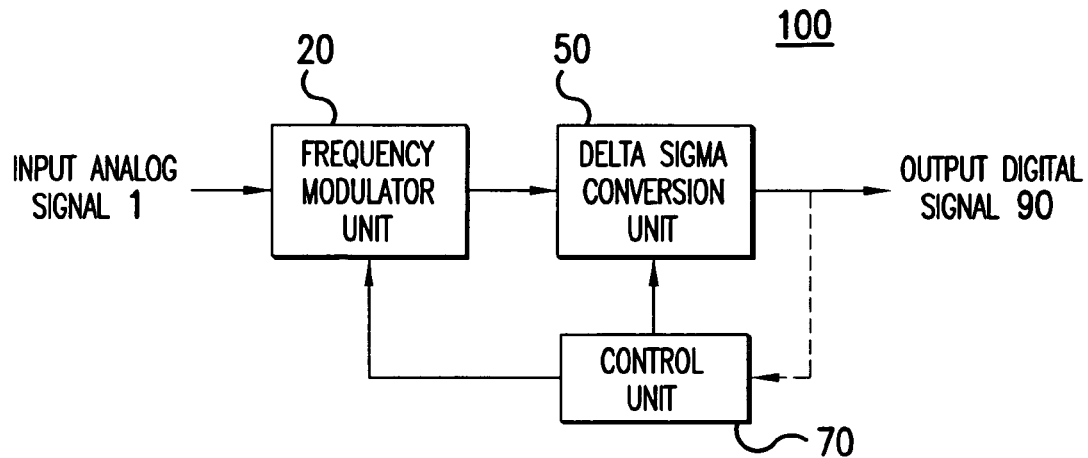
FIG. 1 is a block diagram of a parallel, adaptive delta sigma ADC according to an embodiment of the present invention.

FIG. 1 is a block diagram of a parallel, adaptive delta sigma ADC according to an embodiment of the present invention. The parallel, adaptive delta sigma ADC 100 illustrated in FIG. 1 includes the following components: a frequency modulator unit 20; a delta sigma conversion unit 50; and a control unit 70 operatively connected as shown. An input analog signal 1 enters the parallel, adaptive delta sigma ADC 100 through frequency modulator unit 20. Parallel, adaptive delta sigma ADC 100 converts input analog signal 1 to output digital signal 90. Control unit 70 controls the operation of frequency modulator 20 and delta sigma conversion unit 50. Delta sigma conversion unit 50 may also communicate with control unit 70 before outputting digital signal 90. The parallel, adaptive delta sigma ADC 100 may be built for automatic, manual, or selectable automatic/manual control of output digital signal 90. Operation of the parallel, adaptive delta sigma ADC 100 in FIG. 1 will become apparent from the following discussion.

Figure 2A:
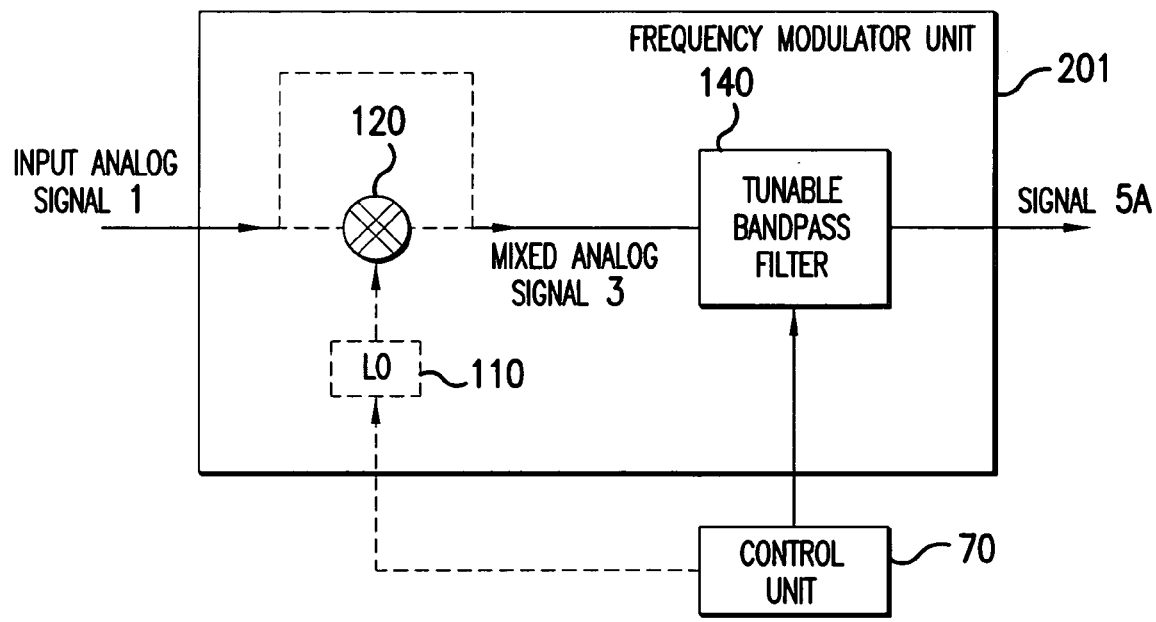
FIG. 2A illustrates a frequency modulator unit included in a parallel, adaptive delta sigma ADC according to an embodiment of the present invention.

FIG. 2A illustrates a frequency modulator unit 201 that may be included in a parallel, adaptive delta sigma ADC 100 according to an embodiment of the present invention. Frequency modulator unit 201 contains a tunable bandpass filter 140 operatively connected as shown. Frequency modulator unit 201 may also contain a local oscillator (LO) 110 and a mixer 120 operatively connected as shown. The LO 110 and mixer 120 are needed when input analog signal 1 lies outside the bandwidth accessible to delta sigma conversion unit 50. For some embodiments, frequency modulator unit 201 may contain a chain of local oscillators 110. Control unit 70 controls tunable bandpass filter 140. Control unit 70 may also control local oscillator 110.

Local oscillator 110 is a semiconductor device or an electronic circuit that generates one or more signals of constant frequency. The frequencies generated by local oscillator 110 are determined by parameters of electronic components inside local oscillator 110 as is known in the art. Mixer 120 is a semiconductor device or electronic circuit that multiplies two signals of different frequencies to obtain a signal of intermediate frequency. A frequency $\upsilon_{LO}$ generated by local oscillator 110 is mixed by mixer 120 with all frequencies contained in input analog signal 1, producing mixed analog signal 3. Each frequency $\upsilon_{in}$ present in input analog signal 1 is shifted to two frequencies $\upsilon_{LO}-\upsilon_{in}$ and $\upsilon_{LO}+\upsilon_{in}$ mixed analog signal 3.

Local oscillator 110 is preferably tunable. This may be accomplished with, for example, a single tunable local oscillator 110 or a chain of tunable local oscillators 110 as is known in the art.

Tunable bandpass filter 140 is a semiconductor device or an electronic circuit that isolates and extracts independent communication channels from the frequency wideband of mixed analog signal 3, and cuts off frequencies in the frequency wideband of mixed analog signal 3 that are either too high or too low. Tunable bandpass filter 140 may be a transmultiplexer; a spectral subband coder that divides an analog signal into frequency segments, or spectral terms, computed for non-overlapped successive blocks of input data; a collection of single-sideband narrowband filters which perform a complex heterodyne, hence basebanding a selected center frequency; a channelizer with suitable RF switches; an antialias filter; a band pass filter; a lowpass filter; or a bandpass and lowpass filter. The center frequency and/or bandwidth of tunable bandpass filter 140 can be changed manually or automatically, so that the passband of tunable bandpass filter 140 matches the bandwidth of interest of delta sigma conversion unit 50, hence eliminating aliasing.

Figure 2B:
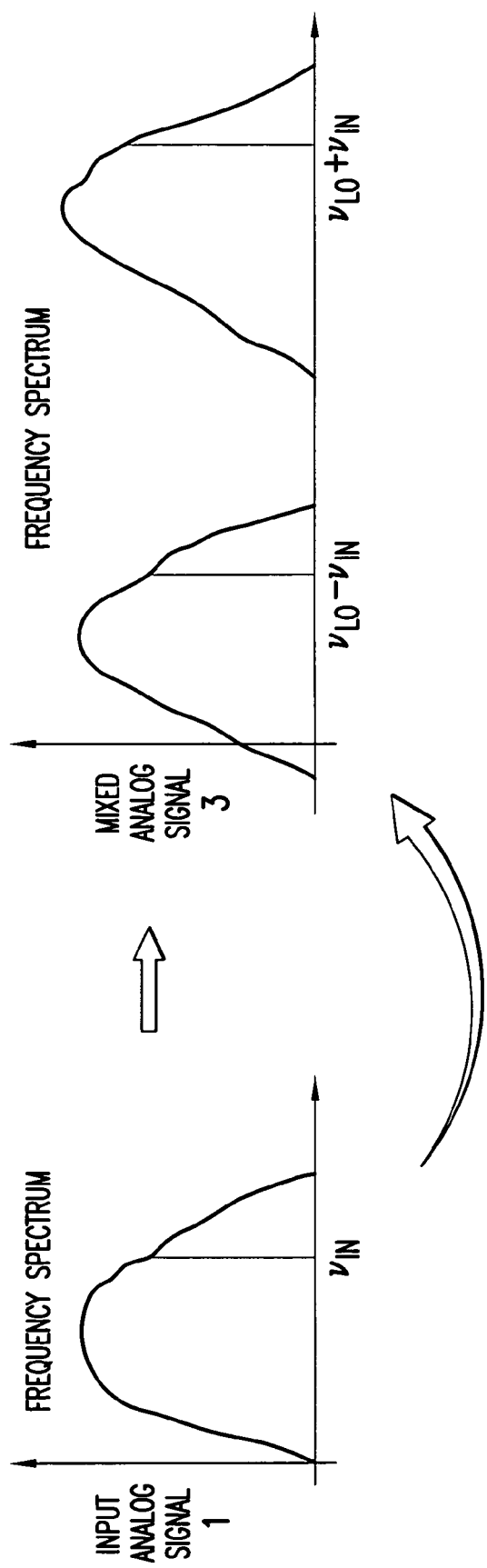
FIG. 2B illustrates aspects of the operation of a local oscillator and a mixer included in a frequency modulator unit according to an embodiment of the present invention.

FIG. 2B illustrates aspects of the operation of a local oscillator 110 and a mixer 120 that may be included in a frequency modulator unit 201 according to an embodiment of the present invention. In case input analog signal 1 occupies a different frequency band than the frequency band parallel, adaptive delta sigma ADC 100 is designed for, the local oscillator 110 may be tuned such that the input signal is downshifted onto a desired bandwidth range.

In other words, the particular design values and construction of the parallel, adaptive delta sigma ADC 100 result in a device having a particular bandwidth range (bandwidth of interest). The local oscillator 10 may be used to shift the input signal onto the bandwidth range of the ADC 100. For this purpose, local oscillator 10 may be tuned by control unit 70 to generate a signal of frequency $\upsilon_{LO}$ which is mixed with all frequencies of input analog signal 1 in mixer 120, producing mixed analog signal 3. Each frequency $\upsilon_{in}$ present in input analog signal 1 is shifted to two frequencies $\upsilon_{LO}-\upsilon_{in}$ and $\upsilon_{LO}+\upsilon_{in}$ in mixed analog signal 3 as illustrated in FIG. 2B. $\upsilon_{LO}$ is chosen so that either $\upsilon_{LO}-\upsilon_{in}$ or $\upsilon_{LO}+\upsilon_{in}$ is located within the frequency band for which the parallel, adaptive delta sigma ADC 100 is designed.

Figure 2C:
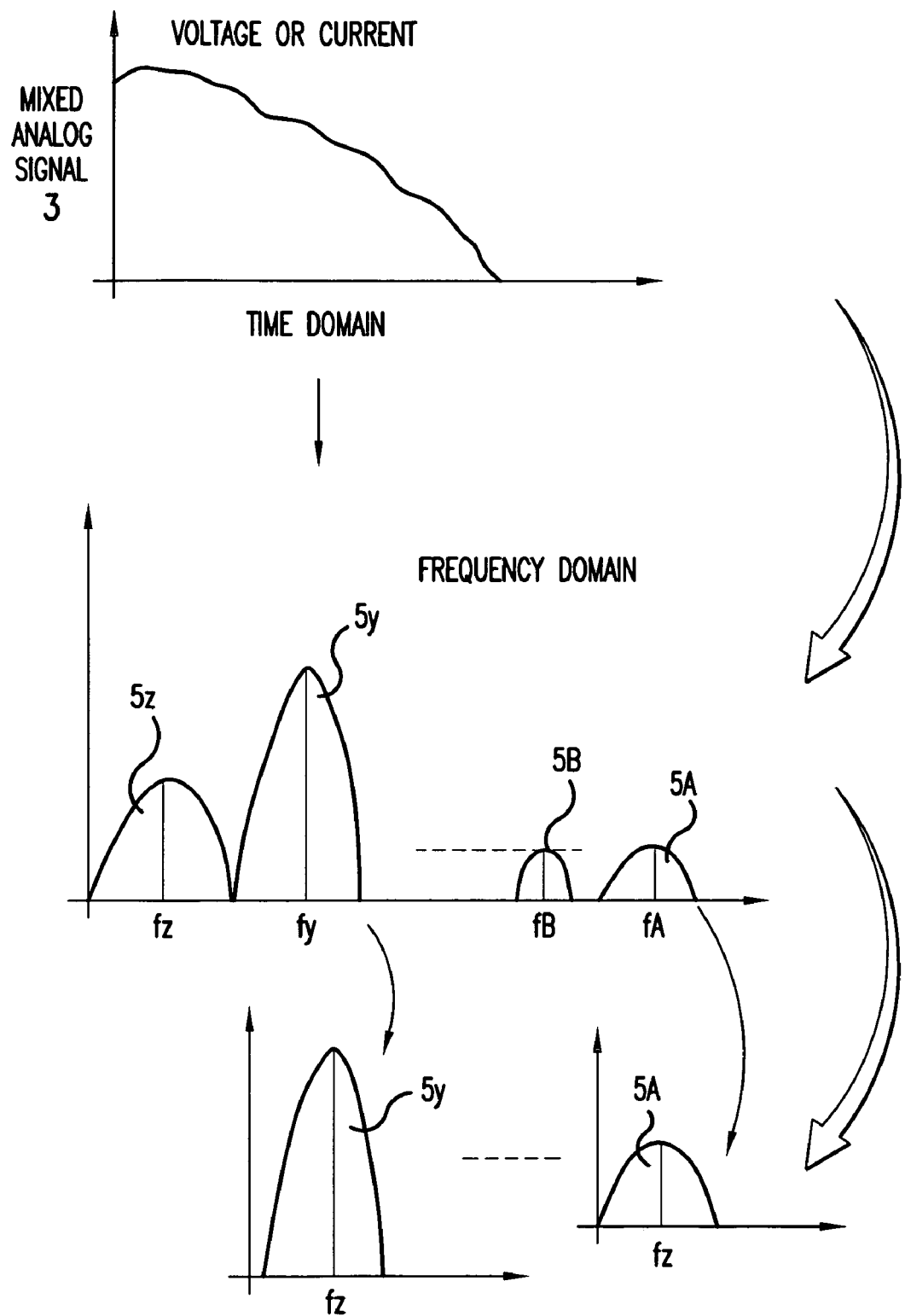
FIG. 2C illustrates aspects of the operation of a tunable bandpass filter included in a frequency modulator unit according to an embodiment of the present invention.

FIG. 2C illustrates aspects of the operation of a tunable bandpass filter 140 included in a frequency modulator unit 201 according to an embodiment of the present invention. Tunable bandpass filter 140 divides the frequency wideband of mixed analog signal 3 into frequency segments 5A, 5B, . . . 5Y, 5Z. The number of frequency segments and the width of frequency segments may be tuned by control unit

70. All frequency segments are then mapped to the lowest frequency segment 5Z, avoiding aliasing of frequency segments.

Figure 3:
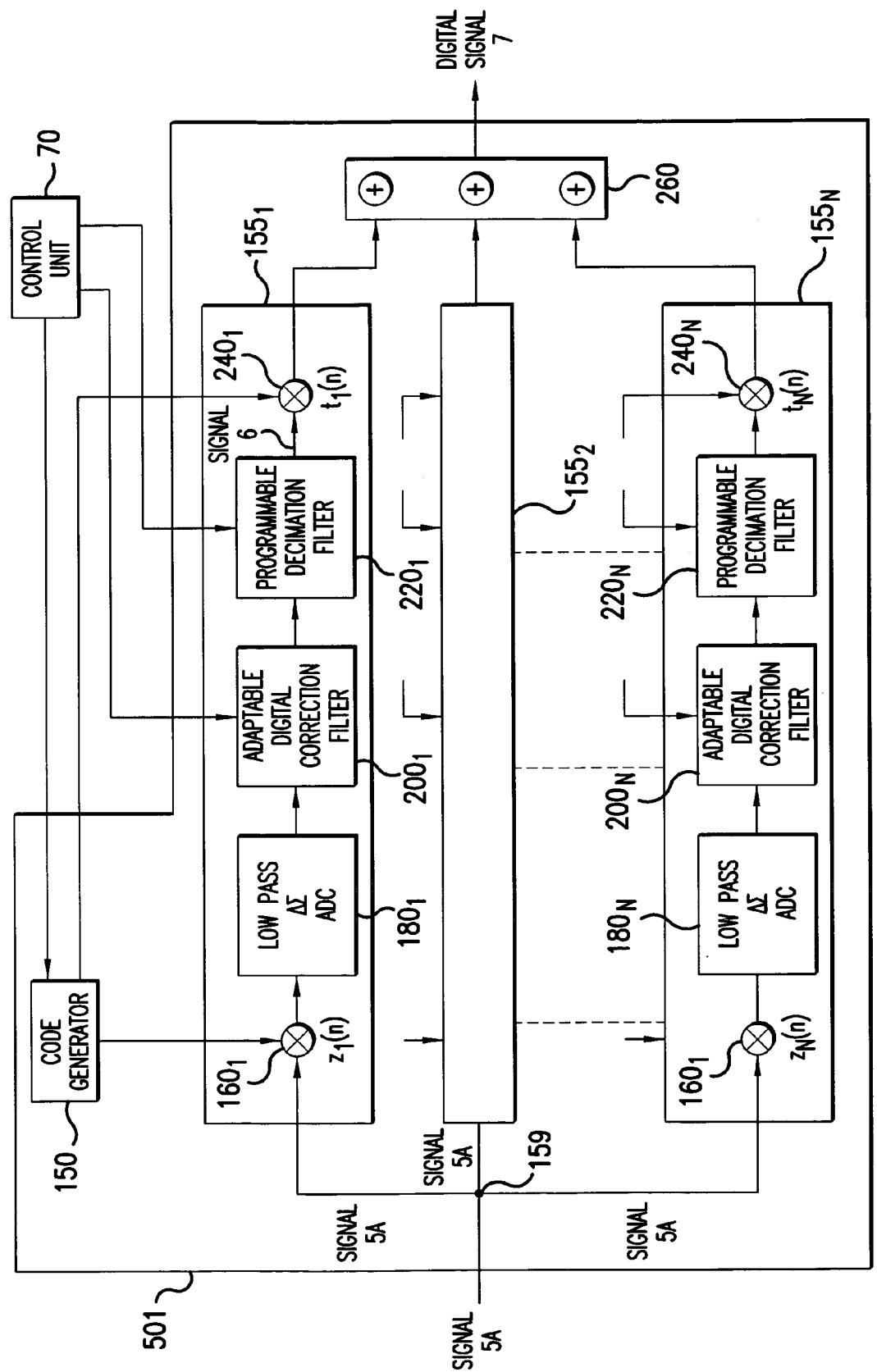
FIG. 3 illustrates a delta sigma conversion unit included in a parallel, adaptive delta sigma ADC according to an embodiment of the present invention.

FIG. 3 illustrates a delta sigma conversion unit 501 that may be included in a parallel, adaptive delta sigma ADC 100 according to an embodiment of the present invention. Delta sigma conversion unit 501 includes a code generator 150, N number of delta sigma (ΔΣ) channels 155$_1$, 155$_2$, ... 155$_N$ connected in parallel, and an adder 260 operatively connected as shown. Each ΔΣ channel 155$_i$ includes an input multiplier 160$_i$, a lowpass ΔΣ ADC 180$_i$, an adaptable digital correction filter 200$_i$, a programmable decimation filter 220$_i$, and an output multiplier 240$_i$, where subscript "i" has values from 1 to N.

A lowpass ΔΣ ADC 180$_i$ is a delta sigma analog-to-digital converter and may be implemented using many possible converter types including low-order single-bit single-loop converter, high-order single-bit single-loop converter, single-bit multiloop (cascaded or MASH) converter and multi-bit (single-loop or multiloop) converter. All lowpass ΔΣ ADCs 180$_i$ (for i from 1 to N) are preferably substantially identical. In one embodiment of the current invention, all lowpass ΔΣ ADC 180$_i$ have the same order, number of bits, and signal delay.

Adaptable digital correction filters 200$_i$, programmable decimation filters 220$_i$, and output multipliers 240$_i$ where subscript "i" has values from 1 to N, are conventional digital electronic devices. They can be implemented using a custom ASIC, an off the shelf FIR filter, a field programmable gate array, or a sufficiently fast microprocessor. The filter coefficients for the adaptable digital correction filters 200$_i$ and the programmable decimation filters 220$_i$, may be stored in a register on the chip that holds the parallel, adaptive delta sigma ADC 100, or in a separate memory off the chip, connected to a data bus. Adaptable digital correction filters 200$_i$, programmable decimation filters 220$_i$, and output multipliers 240$_i$, where subscript "i" has values from 1 to N, may also be combined into a single filter.

As will be further described below, adaptable digital correction filters 200$_i$ and programmable decimation filters 220$_i$ have programmable filter parameters such as length and bandwidth. Adaptable digital correction filters 200$_i$ correct inaccuracies introduced by lowpass ΔΣ ADCs 180$_i$ where subscript "i" has values from 1 to N, and may be implemented using known techniques.

Programmable decimation filters 220$_i$ are used to downsample signals and to eliminate out-of-band noise, and may be implemented using known techniques. Code generator 150 generates a set of codes. Input multipliers 160$_i$ and output multipliers 240$_i$ are standard multiplier circuits whose multiplication values are supplied by codes from the set of codes provided by code generator 150. Adder 260 may be a simple adder circuit that adds its inputs bit-by-bit. Control unit 70 may control code generator 150, adaptable digital correction filters 200$_i$, and programmable decimation filters 220$_i$.

A power splitter 159 simultaneously inputs one of the frequency segments produced by tunable bandpass filter 140 (signal 5A) to all ΔΣ channels 155$_1$, 155$_2$, ... 155$_N$. The set of codes generated by code generator 150 and applied by multipliers 160$_i$ decomposes signal 5A into orthonormal components. Along with other types of codes, a set of Hadamard codes or a set of Gold codes can be generated by code generator 150 for orthonormal decomposition of signal 5A. Each input multiplier 160$_i$ uses one and only one code from the set of codes generated by code generator 150, to create a multiplication value for its frequency decomposing weighting function. Frequency decomposing weighting functions are orthonormal and channel specific. Inside channel i, signal 5A is frequency-decomposed by input multiplier 160$_i$, passed through lowpass ΔΣ ADC 180$_i$, corrected by adaptable digital correction filter 200$_i$ for inaccuracies gained from lowpass ΔΣ ADC 180$_i$, down-sampled by programmable decimation filter 220$_i$ which also eliminates quantization noise, and multiplied by output multiplier 240$_i$ which applies a time-shifted version of the frequency decomposing weighting function of input multiplier 160$_i$, that undoes the frequency decomposing action of input multiplier 160$_i$.

The outputs from all ΔΣ channels 155 are summed by adder 260 to obtain a digital signal 7.

If signal 5A has a frequency spectrum of X GHz, each lowpass ΔΣ ADC 180$_i$ may be clocked at 2× GHz, which is the Nyquist rate of signal 5A frequency spectrum. Each lowpass ΔΣ ADC 180$_i$ is designed to have a band-pass response of X/N, hence the widest bandwidth signal the N-channel parallel, adaptive delta sigma ADC 100 can digitize is X GHz (N*X/N). The oversampling rate (OSR) of delta sigma conversion unit 501 for the entire frequency band of signal 5A is 1, since each lowpass ΔΣ ADC 180$_i$ is clocked at the Nyquist rate of signal 5A frequency spectrum. However, within each ΔΣ channel 155$_i$ the OSR ratio is N, calculated as the ratio of each lowpass ΔΣ ADC 180$_i$ sampling frequency (2×) to the Nyquist frequency of the band-pass response of the channel (2*X/N). Therefore the parallel network of individual ΔΣ channels 155$_i$ has N times larger OSR than a single lowpass ΔΣ ADC 180$_i$ would exhibit.

Figure 4A:
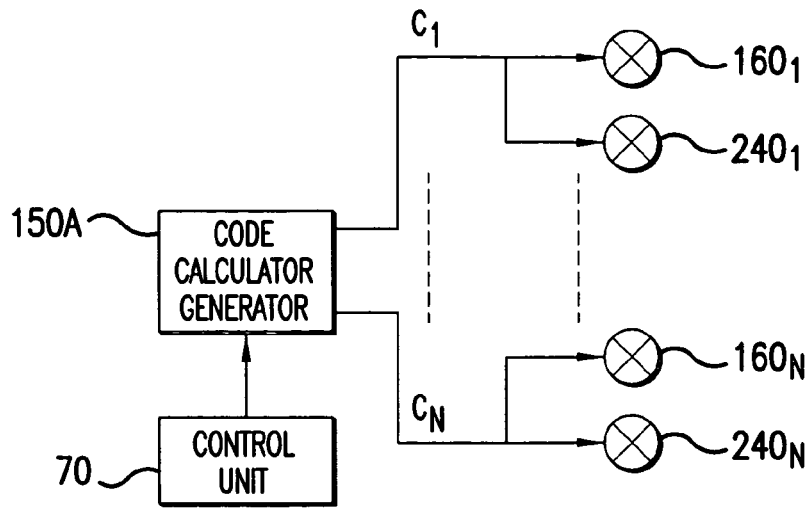
FIG. 4A illustrates a code generator that may be included in a delta sigma conversion unit of a parallel, adaptive delta sigma ADC according to an embodiment of the present invention.

FIG. 4A illustrates a code generator 150A that may be included in a delta sigma conversion unit 501 of a parallel, adaptive delta sigma ADC 100 according to an embodiment of the present invention. Code generator 150A is a code calculator that generates a set of codes in real-time, without any information except the desired length of the set of codes which is supplied by control unit 70. Each code $C_i$ in the set of codes is sent to a pair of input multipliers 160$_i$ and output multipliers 240$_i$. Input multipliers 160$_i$ and output multipliers 240$_i$ generate multiplication values from the code $C_i$ sent to them.

To account for processing times of the ΔΣ ADC 180$_i$, adaptable digital correction filter 200$_i$, and programmable decimation filter 220$_i$, the codes supplied to output multipliers 240$_i$ are preferably time shifted or delayed relative to the input multipliers 160$_i$. This may be accomplished by, for example, a delay element (not shown), by the code calculator generator 150A, or by the control unit 70.

Figure 4B:
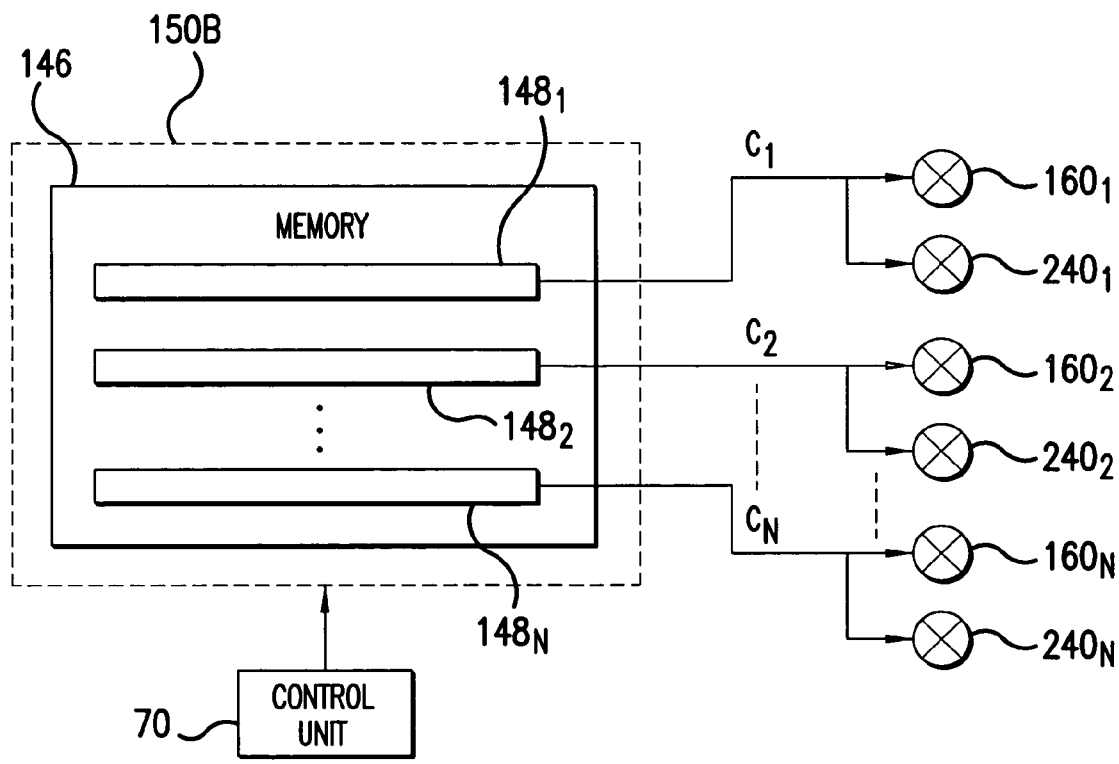
FIG. 4B illustrates a code generator that may be included in a delta sigma conversion unit of a parallel, adaptive delta sigma ADC according to an embodiment of the present invention.

FIG. 4B illustrates a code generator 150B that may be included in a delta sigma conversion unit 501 of a parallel, adaptive delta sigma ADC 100 according to an embodiment of the present invention. Code generator 150B includes a memory 146 with registers or memory locations 148$_1$, 148$_2$, ... 148$_N$ that contain a set of codes. Code generator 150B generates a set of output codes $C_1, C_2 \ldots C_N$ by direct read from memory registers or memory locations 148$_1$, 148$_2$, ... 148$_N$. The code $C_i$ in each register 148$_i$ is directly read into input multiplier 160$_i$ and output multiplier 240$_i$. Input multipliers 160$_i$ and output multipliers 240$_i$ generate multiplication values from code $C_i$.

Figure 4C:
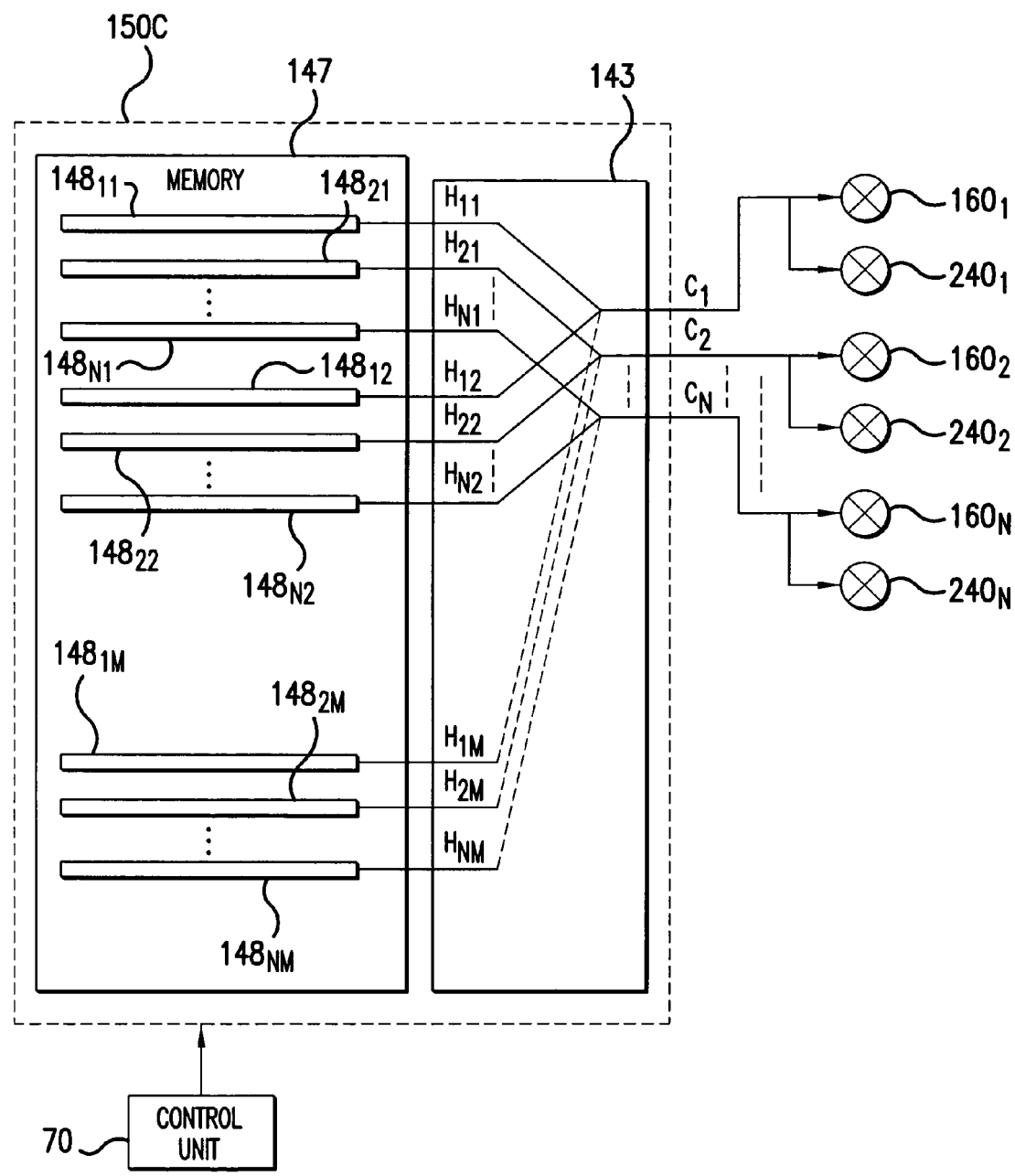
FIG. 4C illustrates a code generator that may be included in a delta sigma conversion unit of a parallel, adaptive delta sigma ADC according to an embodiment of the present invention.

FIG. 4C illustrates a code generator 150C that may be included in a delta sigma conversion unit 501 of a parallel, adaptive delta sigma ADC 100 according to an embodiment of the present invention. Code generator 150C includes a memory 147 with M sets of registers or memory locations. Each register set "j", with "j" from 1 to M, contains N individual registers or memory locations $148_{1j}$, $148_{2j}$, ... $148_{Nj}$. Each register $148_{ij}$ stores an internal code $H_{ij}$. There are N×M internal codes $H_{ij}$ as "i" runs from 1 to N and "j" runs from 1 to M. A switchable lookup table register 143 decides output codes $C_1$, $C_2$ ... $C_N$ by direct read from among all internal codes $H_{ij}$. Output codes $C_1$, $C_2$ .... $C_N$ are sent to all N ΔΣ channels $155_1$, $155_2$, ... $155_N$ to input multiplier $160_i$ and output multiplier $240_i$ where subscript "i" has values from 1 to N. Input multipliers $160_i$ and output multipliers $240_i$ generate multiplication values from the code sent to them. Lookup table register 143 may store one lookup table or multiple lookup tables. An example of a lookup table is:

$$\begin{bmatrix} H_{11} & H_{21} & \cdots & \cdots & H_{N1} \\ \cdots & \cdots & \cdots & \cdots & \cdots \\ \cdots & \cdots & \cdots & \cdots & \cdots \\ H_{1M} & H_{2M} & \cdots & \cdots & H_{NM} \end{bmatrix}.$$

This table would be read by direct memory read, switching between rows to select one row for output codes $C_1$, $C_2$ ... $C_N$.

An example of a multiple lookup table is:

$$\begin{bmatrix} H_{11} & H_{11} & \cdots & H_{11} & H_{21} & H_{21} & \cdots & H_{21} & \cdots & \cdots & H_{N1} & H_{N1} & \cdots & H_{N1} \\ H_{12} & H_{12} & \cdots & H_{12} & H_{22} & H_{22} & \cdots & H_{22} & \cdots & \cdots & H_{N2} & H_{N2} & \cdots & H_{N2} \\ \cdots & \cdots & \cdots & \cdots & \cdots & \cdots & \cdots & \cdots & \cdots & \cdots & \cdots & \cdots & \cdots & \cdots \\ H_{1M} & H_{1M} & \cdots & H_{1M} & H_{2M} & H_{2M} & \cdots & H_{2M} & \cdots & \cdots & H_{NM} & H_{NM} & \cdots & H_{NM} \end{bmatrix}$$

Figure 5:
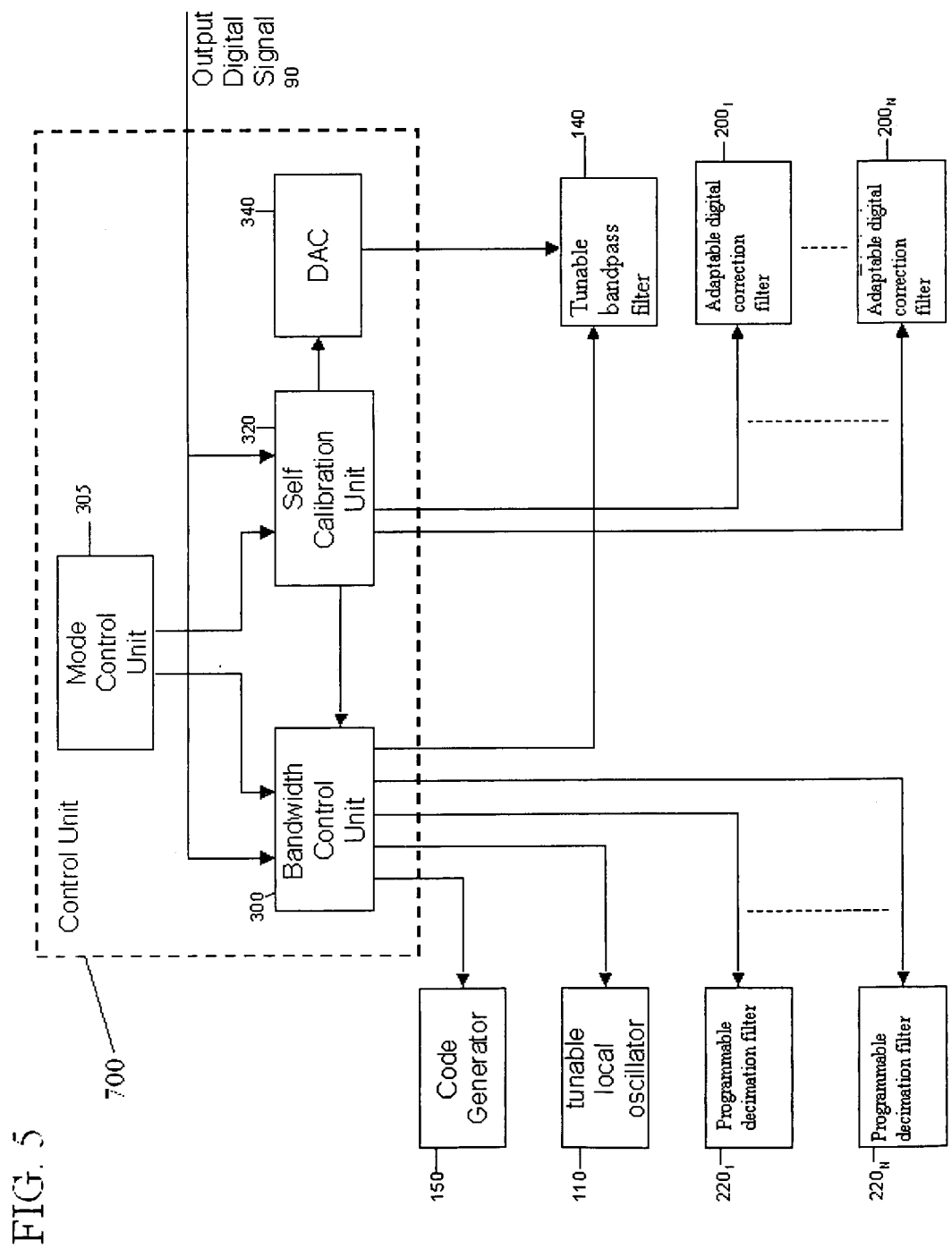
FIG. 5 illustrates a control unit that may be included in a parallel, adaptive delta sigma ADC according to an embodiment of the present invention.

FIG. 5 illustrates a control unit 700 that may be included in a parallel, adaptive delta sigma ADC 100 according to an embodiment of the present invention. Control unit 700 may include the following operational components: a mode control unit 305; a bandwidth control unit 300; a self calibration unit 320; and a DAC 340. Bandwidth control unit 300 controls code generator 150, programmable decimation filters $220_1$, ... $220_N$, tunable bandpass filter 140, and tunable local oscillator 110. Self calibration unit 320 controls adaptable digital correction filters $200_1$, ... $200_N$ and DAC 340, and communicates with bandwidth control unit 300.

The parallel, adaptive delta sigma ADC 100 has two modes of operation: a normal operation mode and a self-calibration mode. Mode control unit 305 determines the operation mode of the parallel, adaptive delta sigma ADC 100.

The parallel, adaptive delta sigma ADC 100 operates in normal operation mode most of the time. In normal operation mode, bandwidth control unit 300 determines the bandwidth of interest using internal algorithms or an external control signal manually or automatically commanded. Bandwidth control unit 300 calculates or looks up the proper code for code generator 150, and calculates filter coefficients for programmable decimation filters $220_i$, where "i" runs from 1 to N. Bandwidth control unit 300 also sets the center frequency and the bandwidth for tunable bandpass filter 140 and tunable local oscillator 110. After sending commands to code generator 150, programmable decimation filters $220_i$, tunable bandpass filter 140, and tunable local oscillator 110, bandwidth control unit 300 remains idle until mode control unit 305 sends a command to change bandwidths again.

In self-calibration mode, self calibration unit 320 takes over bandwidth control unit 300. Self calibration unit 320 sets filter coefficients for adaptable digital correction filters $200_i$ to zero, and then instructs bandwidth control unit 300 to set a predetermined calibration bandwidth. Self calibration unit 320 then creates a calibration signal using the built-in DAC 340. The DAC 340 feeds the calibration signal to tunable bandpass filter 140 as an input. The calibration signal is processed by tunable bandpass filter 140 in the same manner as in normal mode operation. The digital output of the delta sigma conversion unit 501 is fed back to self calibration unit 320. Self calibration unit 320 calculates a final set of adaptable digital correction filter $200_i$ coefficients for use when control unit 700 and parallel, adaptive delta sigma ADC 100 return to normal mode operation.

Mode control unit 305 may be a part of control unit 700. In another embodiment of the invention, mode control unit 305 may be external to the parallel, adaptive delta sigma ADC 100. The DAC 340 may be any conventional DAC. The DAC 340 function may also be generated by an alternate analog frequency synthesis technique. Mode control unit 305, bandwidth control unit 300, and self calibration unit 320 may be implemented using a single field programmable gate array; an ASIC; a microcontroller; a standard microprocessor; or a memory or set of memories.

Figure 6:
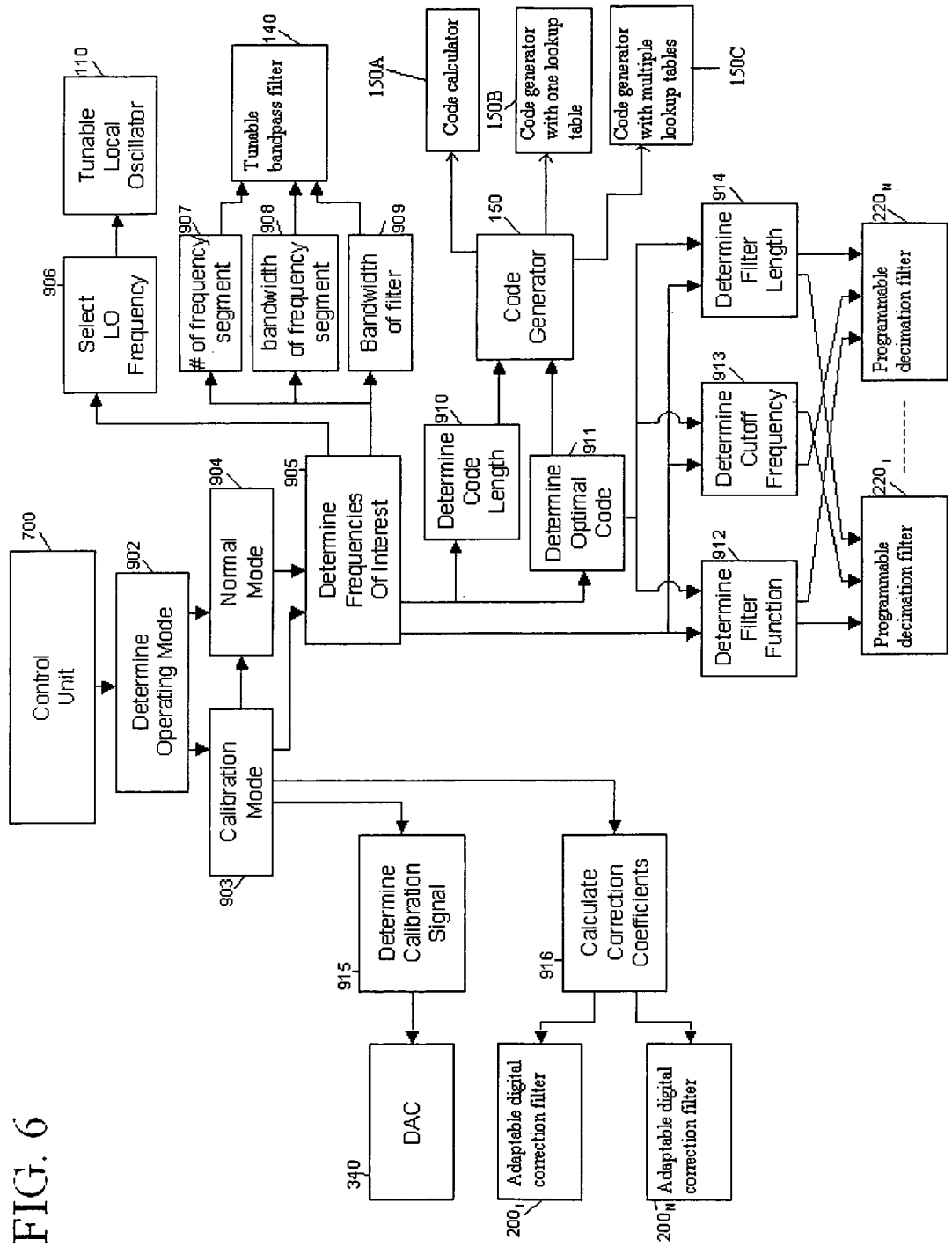
FIG. 6 illustrates aspects of the operation of a control unit that may be included in a parallel, adaptive delta sigma ADC according to an embodiment of the present invention.

FIG. 6 illustrates aspects of the operation of a control unit 700 that may be included in a parallel, adaptive delta sigma ADC 100 according to an embodiment of the present invention. Control unit 700 selects (902) the operation mode of the parallel, adaptive delta sigma ADC 100.

If the selected operation mode is the normal operation mode (904), control unit 700 determines (905) the frequency or frequencies of interest for the parallel, adaptive delta sigma ADC 100. Next, control unit 700 controls tunable local oscillator 110 by selecting (906) the frequency of tunable local oscillator 110; controls the tunable bandpass filter 140 by selecting the number of desired frequency segments (907), and/or the bandwidth of frequency segments (908), and/or the filter bandwidth (909); determines the length of code (910) and the type of code (911) for code generator 150; and controls programmable decimation filters $220_1$ ... $220_N$ by selecting the filters' function (912), cutoff frequency (913), and length (914). In one embodiment of the invention, code calculator generator 150A directly calculates a code according to a selected code length (910). In other embodiments of the invention, code generators 150B and/or 150C choose an appropriate lookup table and/or lookup table read rate according to the selected code length (910) and the type of code (911).

If the selected operation mode is the self-calibration mode (903), control unit 700 determines a calibration signal (915) for an appropriate calibration bandwidth, and sends it to DAC 340. Control unit 700 also controls the adaptable digital correction filters $200_1$, ... $200_N$ by calculating (916) proper filter correction coefficients.

Figure 7:
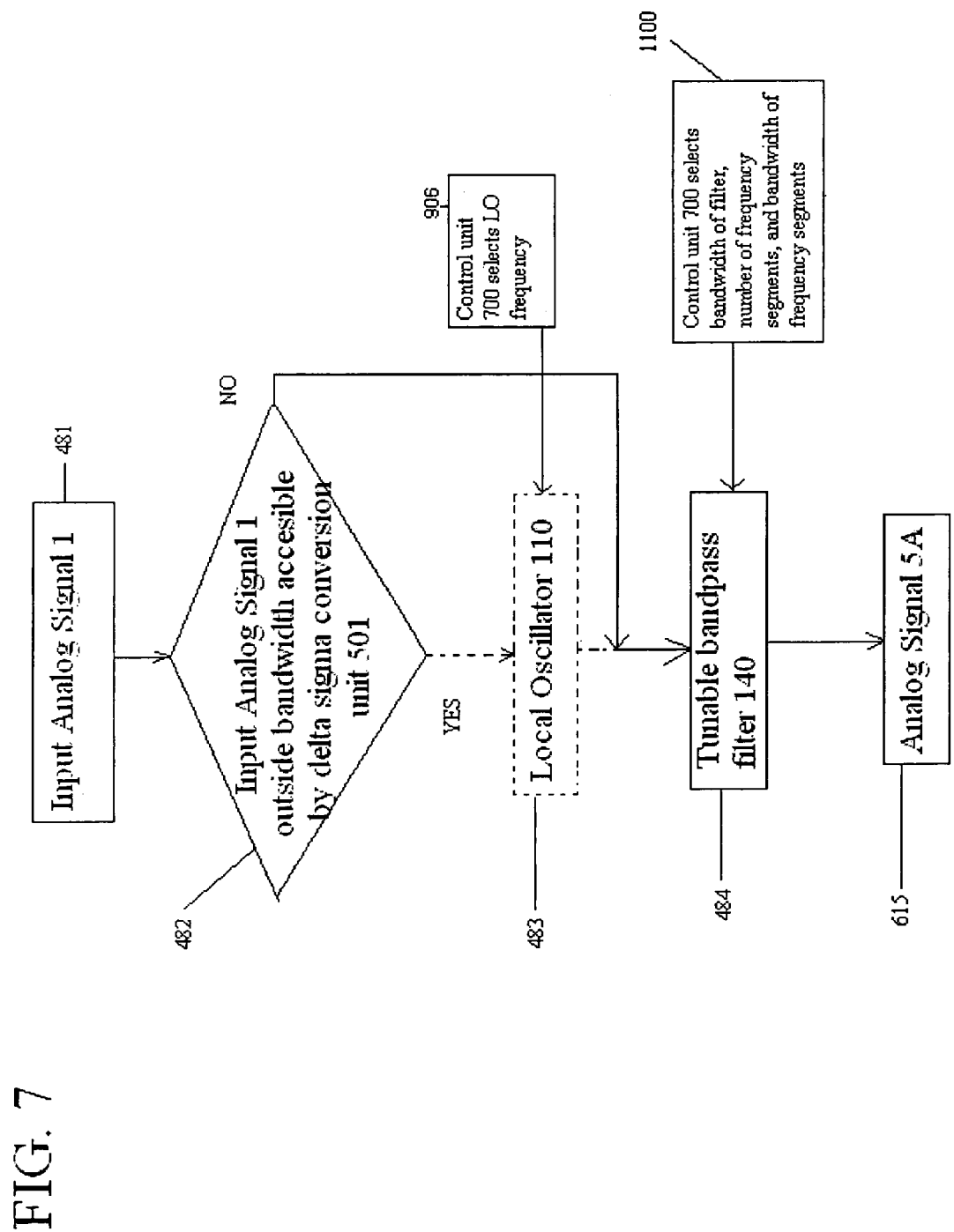
FIG. 7 is a flow diagram illustrating operations performed by a frequency modulator unit according to an embodiment of the present invention.

FIG. 7 is a flow diagram illustrating operations performed by a frequency modulator unit 201 according to an embodiment of the present invention. An analog signal 1 (481) is input into frequency modulator unit 201. A test is performed (482) to determine whether input analog signal 1 lies outside the bandwidth accessible by delta sigma conversion unit 501. If input analog signal 1 lies outside the bandwidth accessible by delta sigma conversion unit 501, input analog signal 1 frequency is shifted to a frequency accessible to delta sigma conversion unit 501, using (483) tunable local oscillator 110 whose frequency is controlled (906) by control unit 700. Input analog signal 1 is then filtered (484) by tunable bandpass filter 140 that is controlled (1100) by control unit 700. The output of frequency modulator unit 201 is analog input signal 5A (615).

Figure 8:
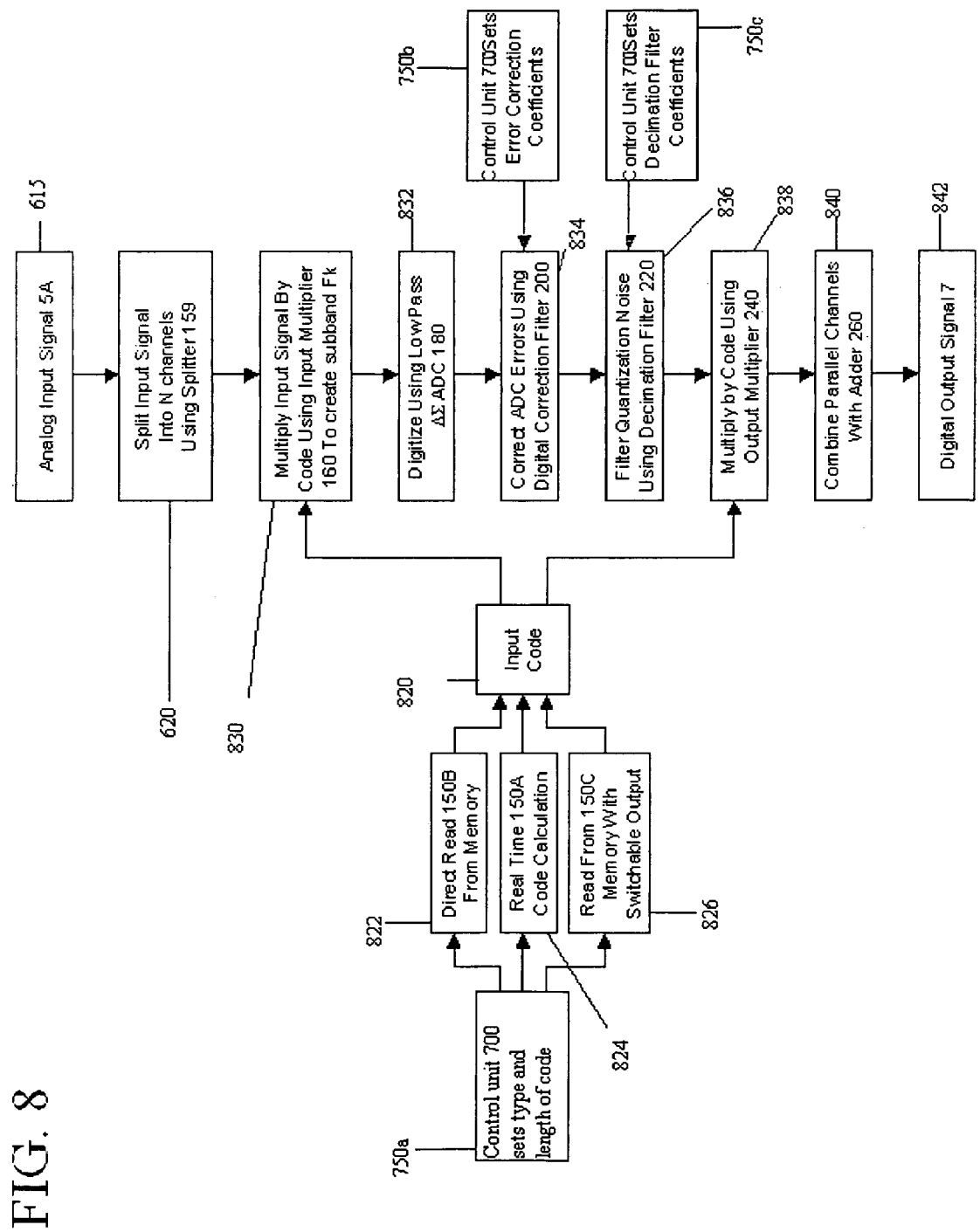
FIG. 8 is a flow diagram illustrating operations performed by a delta sigma conversion unit according to an embodiment of the present invention.

FIG. 8 is a flow diagram illustrating operations performed by a delta sigma conversion unit 501 according to an embodiment of the present invention. Delta sigma conversion unit 501 is designed to convert a bandwidth or set of separate bandwidths present in input analog signal 1 into a digital signal. Analog signal 5A (615) output from frequency modulator unit 201 has a continuous low frequency band or an arbitrary set of bandwidths.

Power splitter 159 splits (620) analog signal 5A into N identical signal channels. Each signal channel is passed to a $\Delta\Sigma$ channel $155_i$, with subscript "i" having values from 1 to N. In each $\Delta\Sigma$ channel $155_i$, input multiplier $160_i$ multiplies (830) the signal channel by a code from a code set (820) created by code generator 150. Power splitter 159 and input multipliers $160_i$ break the band or bands of interest of analog signal 5A into many continuous low frequency bands, by decomposing input analog signal 5A into several subbands in which frequencies of interest are translated bit-by-bit to low frequency in each of the $\Delta\Sigma$ channels $155_i$.

Control unit 700 sets (750a) the type and length of the code set that may be generated by real time calculation (824) in a code calculator generator 150A, by direct read (822) from a memory 150B containing a lookup table, or by direct read (826) from a memory with switchable output 150C containing a group of code sets located in a memory lookup table. The generated code set is sent (820) to input multipliers $160_i$ and output multipliers $240_i$.

The signal channel in each $\Delta\Sigma$ channel $155_i$ is then converted (832) to a digital signal channel by lowpass $\Delta\Sigma$ ADC $180_i$. Errors introduced by lowpass $\Delta\Sigma$ ADCs $180_i$ are compensated (834) by the adaptable digital correction filters $200_i$ whose filter correction coefficients are set (750b) by control unit 700. Quantization noise is removed (836) by programmable decimation filters $220_i$ whose decimation filter coefficients are set (750c) by control unit 700.

The digital signal channel in each $\Delta\Sigma$ channel $155_i$ is demodulated (838) by output multiplier $240_i$ and is output from the $\Delta\Sigma$ channel $155_i$. The output digital signal channels from all parallel $\Delta\Sigma$ channels $155_i$ for "i" from 1 to N are added (840) together by adder 260. The output (842) of the adder is digital signal 7.

For analog input signal 5A to be accurately digitally reconstructed from the outputs of programmable decimation filters $220_i$, the coefficients of programmable decimation filters $220_i$ are adapted (750c) by control unit 700 to the specific code (820) that was generated by code generator 150. Hence, changing the code (820) generated by code generator 150 and the coefficients of programmable decimation filters $220_i$ with "i" from 1 to N, changes the band or bands in analog input signal 5A that can be processed by delta sigma conversion unit 501. Therefore, by changing the code generated by code generator 150 and the coefficients for programmable decimation filters $220_i$, the parallel, adaptive delta sigma ADC 100 can change bandwidth and dynamic range. One set of codes and programmable decimation filters coefficients may create a wideband low dynamic range modulator, while another set of codes and programmable decimation filters coefficients may create a narrow band, high dynamic range modulator. The parallel $\Delta\Sigma$ channels $155_i$ may also be split into separate channel groups to create a modulator with separate pass-bands. In this case, separate bands of different bandwidth as well as continuous bands from analog signal 5A can be processed by the parallel, adaptive delta sigma ADC 100.

Figure 9A:
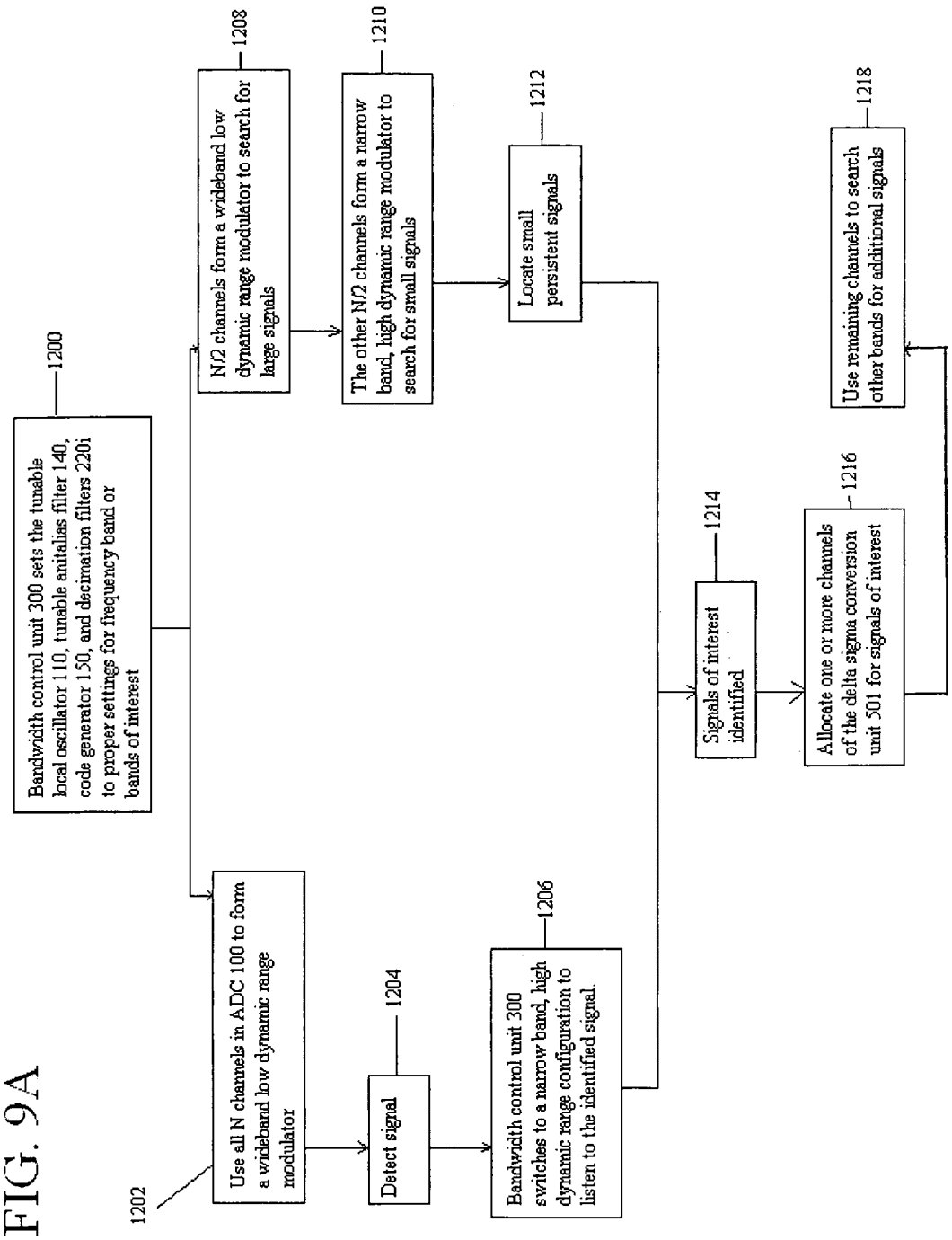
FIG. 9A is a flow diagram illustrating aspects of an exemplary normal mode operation of a control unit included in a parallel, adaptive ADC according to an embodiment of the present invention.

FIG. 9A is a flow diagram illustrating aspects of an exemplary normal operation mode of a control unit 700 included in a parallel, adaptive delta sigma ADC 100 according to an embodiment of the present invention. In a normal operation mode, bandwidth control unit 300 included in control unit 700 sets (1200) the tunable local oscillator 110, the tunable bandpass filter 140, the code generator 150, and the programmable decimation filters $220_i$ to proper settings for a frequency band or bands of interest. The frequency band or bands of interest can be selected by bandwidth control unit 300, or by an external command from an external signal. When signals of interest and consequently bands of interest are unknown, such as in passive listening of signals or in electronic signal warfare, bandwidth control unit 300 selects the frequency band or bands of interest using a self adaptive algorithm. When the input signals are known, such as in a RADAR signal emission, an external signal may direct the bandwidth control unit 300 to a specific frequency band with a desired dynamic range.

An exemplary self adaptive algorithm is presented in FIG. 9A. In one logic flow, the bandwidth control unit 300 sets (1202) all N parallel $\Delta\Sigma$ channels $155_i$ of delta sigma conversion unit 501 in use to form a wideband low dynamic range modulator to search for signals. Once a signal is detected (1204), bandwidth control unit 300 switches (1206) to a narrow band, high dynamic range configuration, to listen to the identified signal. This logic flow works well for large complex signals. A second logic flow may search for both large and small signals using (1208) half of the N parallel $\Delta\Sigma$ channels $155_i$ to form a wideband low dynamic range modulator to search for large signals, and half (1210) of the N parallel $\Delta\Sigma$ channels $155_i$ to form a narrow band, high dynamic range modulator to search for small signals. By slowly sweeping the center frequency of the high dynamic range band, bandwidth control unit 300 can locate (1212) small persistent signals. Once one or more signals of interest have been identified (1214), the bandwidth control unit 300 can allocate one or more parallel $\Delta\Sigma$ channels $155_i$ of the delta sigma conversion unit 501 to listen (1216) to the signals of interest, while using the remaining parallel $\Delta\Sigma$ channels $155_i$ to search (1218) for additional signals in other bands.

Figure 9B:
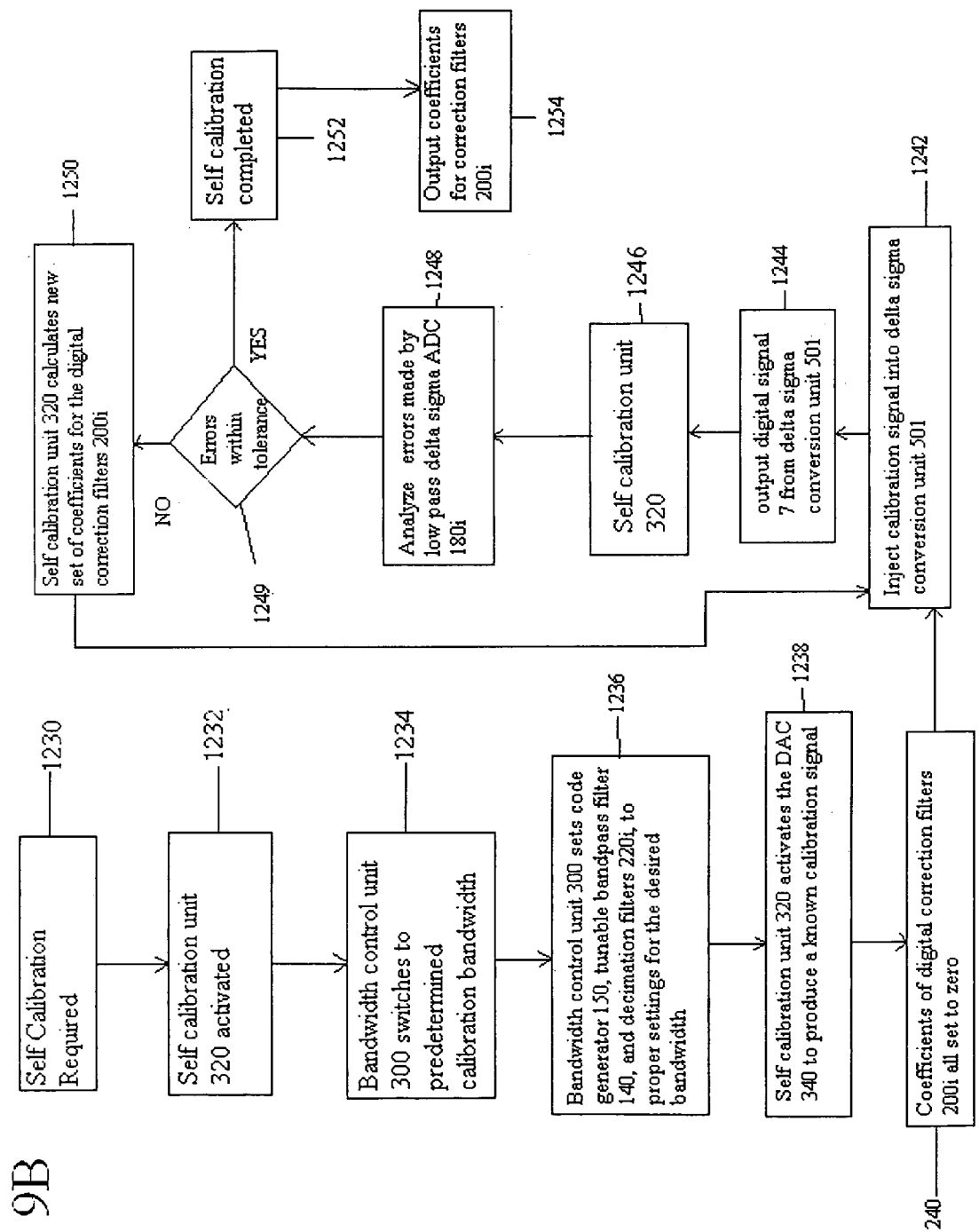
FIG. 9B is a flow diagram illustrating aspects of an exemplary self calibration mode operation of a control unit included in a parallel, adaptive ADC according to an embodiment of the present invention.

FIG. 9B is a flow diagram illustrating aspects of an exemplary self-calibration operation mode of a control unit 700 included in a parallel, adaptive delta sigma ADC 100 according to an embodiment of the present invention. In self-calibration mode, the small errors introduced by delta sigma modulators $180_i$ are quantified. Error quantification is important because it allows for error correction and compensation by adaptable digital correction filters $200_i$. One exemplary implementation of error quantification and correction is shown in FIG. 9B, where a known signal is input into the delta sigma conversion unit 501, and the output of the delta sigma conversion unit 501 is examined to determine introduced errors.

When control unit 700 decides that it is time for a self calibration cycle (1230) based on some external input or some internal routine, it activates (1232) the self calibration unit 320, which instructs the bandwidth control unit 300 to switch (1234) to a predetermined calibration bandwidth. The bandwidth control unit 300 sets (1236) the code generator 150, tunable bandpass filter 140, and decimation filters 220$_i$, to the proper settings for the desired bandwidth. The self calibration unit 320 then activates the DAC 340 to produce (1238) a known calibration signal which is injected (1242) into the delta sigma conversion unit 501. The coefficients on the digital correction filters 200$_i$ are all set to zero (1240) so that no digital correction is performed. The uncorrected digital output signal 7 (1244) is fed back (1246) to the self-calibration unit and analyzed to determine what errors (1248) are introduced by the low pass ΔΣ ADCs 180$_i$. The self-calibration unit uses this signal to calculate (1250) a new set of coefficients (1254) for the adaptable digital correction filters 200$_i$ with "i" from 1 to N.

Optionally, the calibration signal could be reinjected into delta sigma conversion unit 501 (1242) using the most recent set of adaptable digital correction filters 200$_i$ coefficients. The output is re-measured to determine if errors are within tolerance (1249). Such errors are primarily nonlinearities and variations in gain from one ΔΣ channels 155$_i$ to another. If the errors are within tolerance, the self calibration is completed (1252) and the latest found set of coefficients for adaptable digital correction filters 200$_i$ with "i" from 1 to N, are stored to be used (1254) until the next self calibration cycle. Other variations on the self-calibration routine include calibrating each channel one at a time, and calibrating at various frequencies to eliminate frequency dependent errors.

Figure 10:
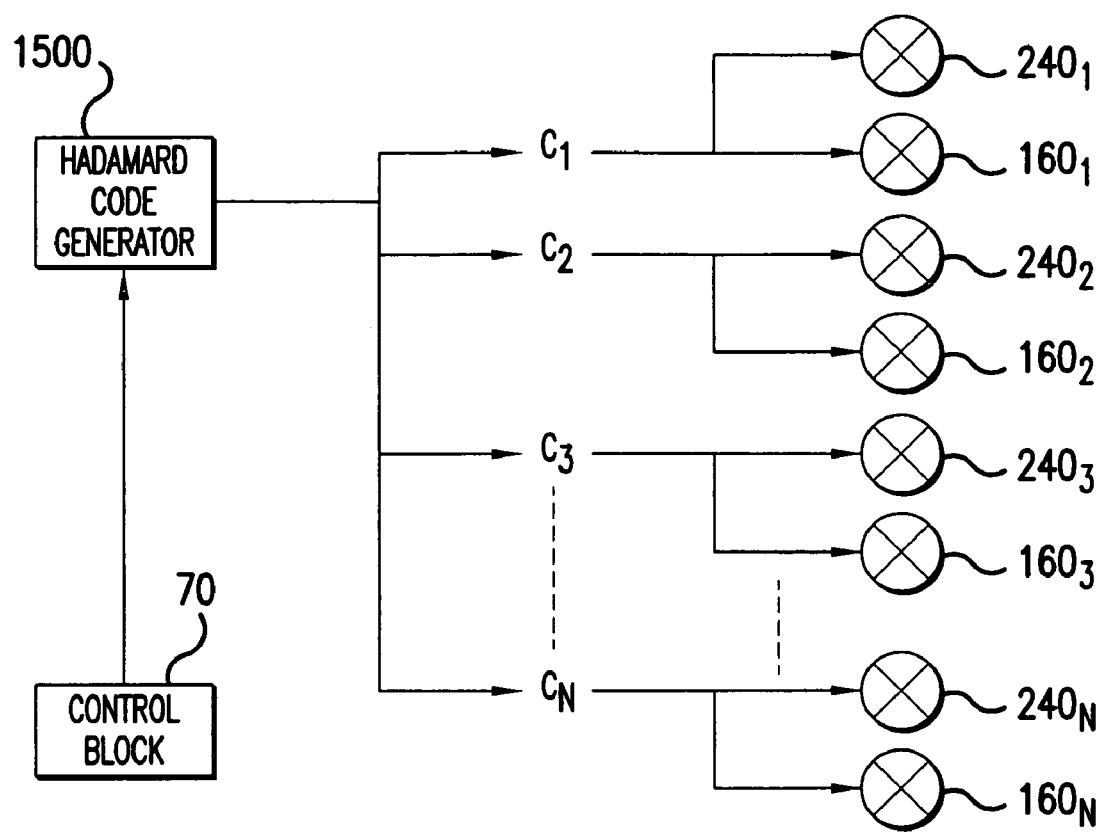
FIG. 10 illustrates an exemplary Hadamard code generator included in a delta sigma conversion unit according to an embodiment of the present invention.

FIG. 10 illustrates an example of code generator 150 (Hadamard code generator 1500) that may be included in a delta sigma conversion unit 501 according to an embodiment of the present invention. The orthogonal set of codes generated by a Hadamard code generator 1500 is used in a preferred embodiment of the current invention. A Hadamard code generator 1500 generates a Hadamard code from a conventional Hadamard matrix. The elements of a Hadamard matrix are 1s and –1s. The size of the Hadamard matrix used by Hadamard code generator 1500 is N×N, where N is the number of ΔΣ channels 155 in delta sigma conversion unit 50. In order for the Hadamard matrix to exist, N can be a non-negative power of 2, or another number for which Hadamard matrices are known to exist. Such numbers may include all multiples of 4 smaller than 428. For N=1 the Hadamard matrix is $H_1=[1]$. For N≧2, Hadamard matrix of order N, $H_N$, is defined recursively as follows:

$$H_N = \begin{bmatrix} H_{N/2} & H_{N/2} \\ H_{N/2} & -H_{N/2} \end{bmatrix}.$$

The N-by-N Hadamard matrix has the property that $H_N H_N^T = N I_N$ where $I_N$ is the N-by-N identity matrix. The rows and columns of the Hadamard matrix are mutually orthogonal. The Hadamard codes 151 generated by Hadamard code generator 1500 are the individual rows of the N×N Hadamard matrix. The orthogonal set of codes 151 is sent to input multipliers 160 and to output multipliers 240.

Figure 11:
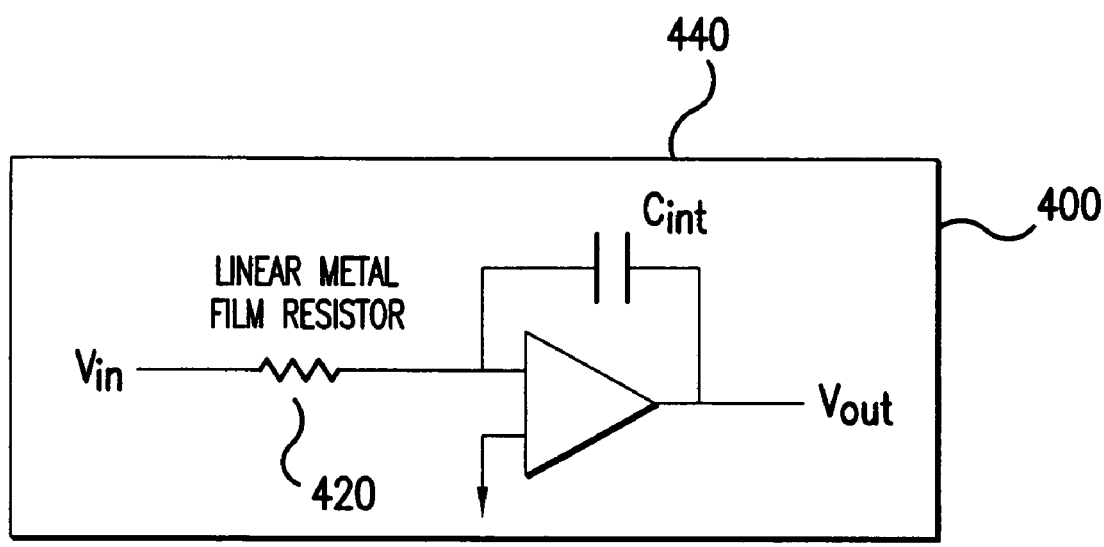
FIG. 11 illustrates a continuous time integrator circuit that may be included in a delta sigma ADC according to an embodiment of the present invention.

FIG. 11 illustrates a continuous time integrator circuit 400 that may be included in a ΔΣ ADC 180$_i$ from a delta sigma conversion unit 501, according to an embodiment of the present invention. An exemplary embodiment of this invention uses a continuous time $4^{th}$ order cascade of resonator filters that exhibits high stability. A building block of the filter is a continuous time integrator 400 illustrated in FIG. 8. A transconductor stage charging a capacitor 440 implements the integrating function. A metal film resistor 420 is used in place of a transconductance element to improve and maintain the high degree of linearity required for high dynamic range performance of ΔΣ ADCs 180. The schematic in FIG. 11 is a single ended design. A fully differential design such as that shown in FIG. 12 can also be used.

Figure 12:
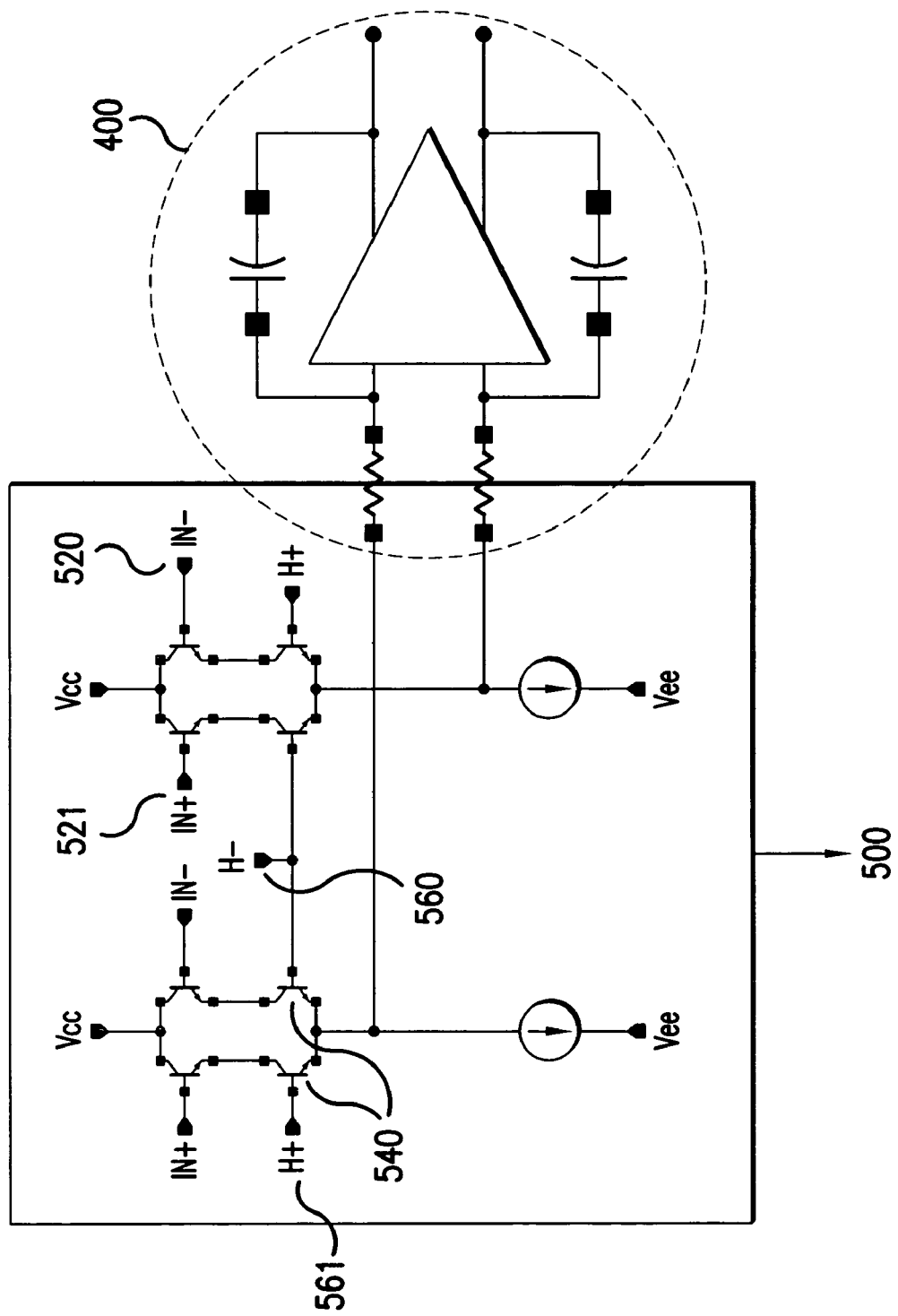
FIG. 12 illustrates a polarity reversal circuit that may be included in input and output multipliers of a delta sigma conversion unit according to an embodiment of the present invention.

FIG. 12 illustrates a polarity reversal circuit 500 that may be included in input multipliers 160$_i$ and output multipliers 240$_i$ of a delta sigma conversion unit 501 according to an embodiment of the present invention. The polarity reversing circuit 500 reverses the differential input lines 520 and 521 to ΔΣ ADCs 180 at the appropriate times when the +/–1 Hadamard input multiplier sequences 152 and Hadamard output multiplier sequences 153 are applied to signal 5A. An exemplary implementation of polarity reversal circuit 500 uses current steering bipolar switches 540 in emitter-follower unity gain buffers connected at the input of continuous time integrator circuit 400 of the first resonator in the continuous time $4^{th}$ order cascade of resonators filter in ΔΣ ADCs 180. Bipolar transistors perform well as high-speed current switches and the negative feedback of the emitter-follower buffer configuration maintains circuit linearity. The input lines 560 and 561 labeled H+ and H– in the circuit diagram of FIG. 9 correspond to logical levels of 1 and –1 in a differential Hadamard input multiplier sequence 152 or Hadamard output multiplier sequence 153. Polarity reversal circuit 500 is used to switch the inputs to the integrator 400, between input value and inverted input value. Polarity reversal circuit 500 combines input multiplier 160$_i$ with the input stage of its corresponding lowpass ΔΣ ADC 180$_i$. As a result, input multipliers 160$_i$ do not add additional nonlinearities into the delta sigma conversion unit 501.

FIGS. 13A, 13B, 13C, 14A and 14B illustrate a particular, non-limiting example of the invention. In this example, it is assumed that the bandwidth control unit 300 of control unit 700 has decided or has been instructed to form a single broadband modulator using four channels, that is N=4. The four channels cover the entire Nyquist band of the delta sigma conversion unit 501. The signals at various points in the delta sigma conversion unit 501 are calculated to demonstrate the basic principle of delta sigma analog-to-digital conversion.

Figure 13A:
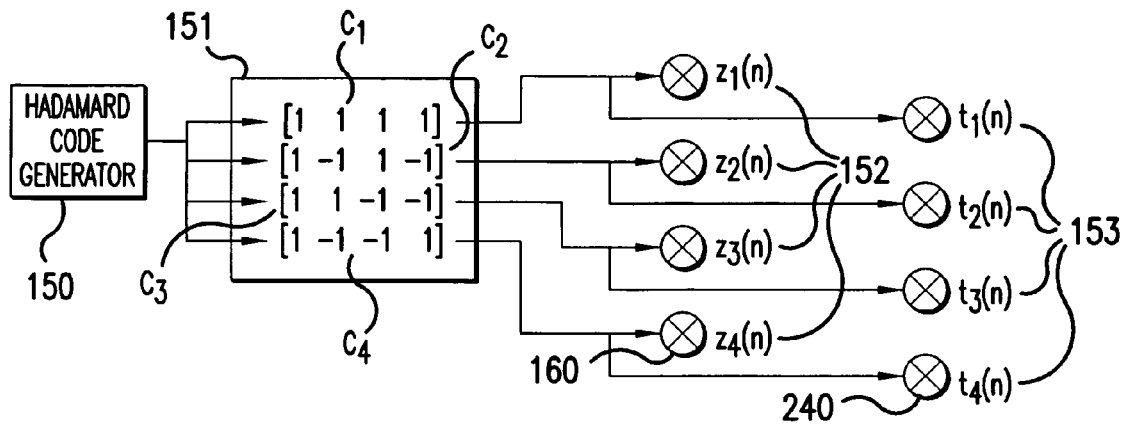
FIG. 13A illustrates an exemplary set of Hadamard codes that may be produced by a Hadamard code generator, according to an embodiment of the present invention.

FIG. 13A illustrates an exemplary set of Hadamard codes 151 that may be produced by a Hadamard code generator 1500 for number N of ΔΣ channels 155$_i$ in delta sigma conversion unit 501 with N=4, according to an embodiment of the present invention. Since $H_1=[1]$, it follows that $$H_2 = \begin{bmatrix} H_1 & H_1 \\ H_1 & -H_1 \end{bmatrix} = \begin{bmatrix} 1 & 1 \\ 1 & -1 \end{bmatrix}$$

and $$H_4 = \begin{bmatrix} H_2 & H_2 \\ H_2 & -H_2 \end{bmatrix} = \begin{bmatrix} 1 & 1 & 1 & 1 \\ 1 & -1 & 1 & -1 \\ 1 & 1 & -1 & -1 \\ 1 & -1 & -1 & 1 \end{bmatrix}.$$

The Hadamard codes 151 produced by Hadamard code generator 1500 for N=4 are the rows of Hadamard matrix $H_4$. Hence the Hadamard codes 151 for N=4 are:

$C1 = [1\ 1\ 1\ 1]$ $C2 = [1\ -1\ 1\ -1]$ $C3 = [1\ 1\ -1\ -1]$ $C4 = [1\ -1\ -1\ 1]$.

Hadamard input multiplier sequences 152 are generated from Hadamard codes C1, C2, C3 and C4 for input multipliers 160. Similarly, Hadamard output multiplier sequences 153 are generated from Hadamard codes C1, C2, C3 and C4 for output multipliers 240.

Figure 13B:
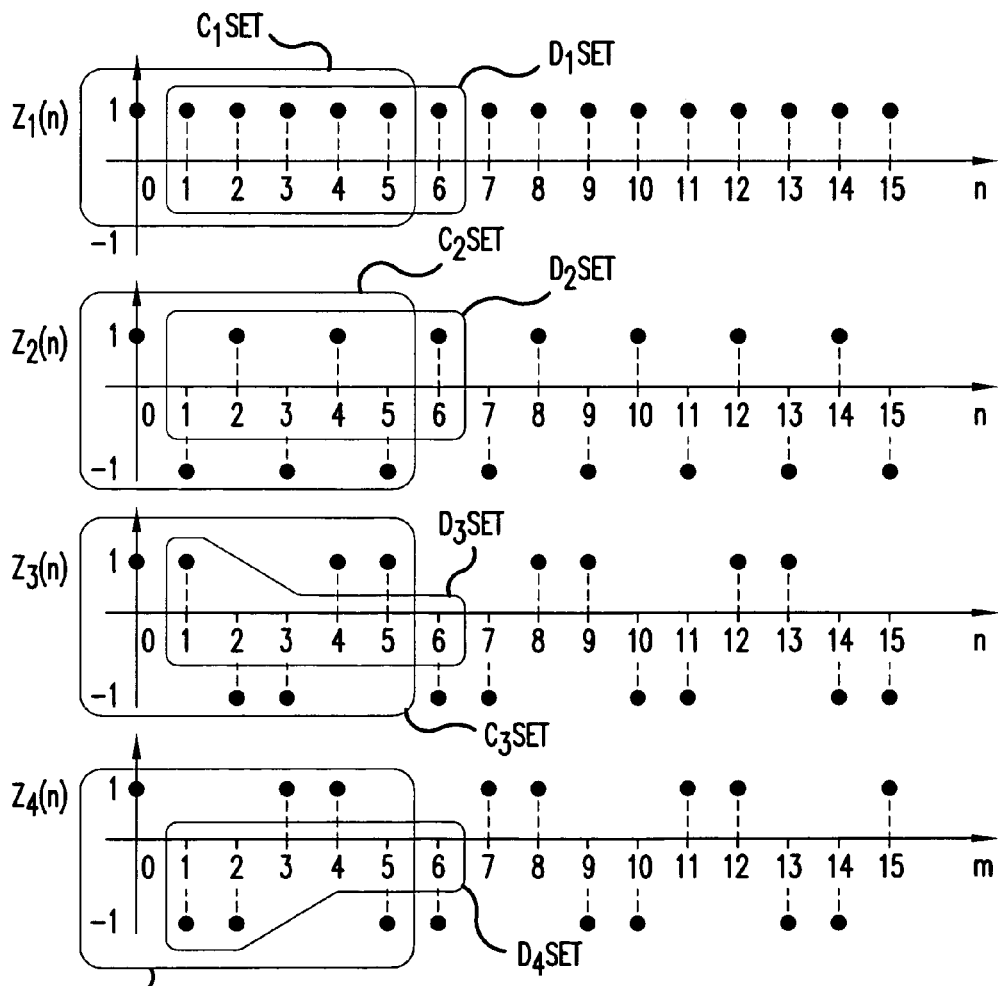
FIG. 13B illustrates an exemplary set of Hadamard input multiplier sequences that may be used by input multipliers in a delta sigma conversion unit, according to an embodiment of the present invention.

FIG. 13B illustrates an exemplary set of Hadamard input multiplier sequences 152 that may be used by input multipliers 160 in a delta sigma conversion unit 501 for number N of ΔΣ channels $155_i$ in delta sigma conversion unit 501 with N=4, according to an embodiment of the present invention. Hadamard input multiplier sequences 152 $z_i(n)$ are obtained from Hadamard codes 151 by the following formula:

$$z_i(n) = C_i[n \bmod N]$$

where A mod B is the modulus function that returns the integer remainder value when A is divided by B, and i is the index for each ΔΣ channel 155 in delta sigma conversion unit 50, i running from 1 to N. Other formulas for obtaining Hadamard input multiplier sequences 152 $z_i(n)$ are also possible and various lookup tables may also be used to supply the Hadamard code sequences as described in relation to FIGS. 4B and 4C. The first element in matrices $C_i$ has index 0, therefore $C_i$ elements have indices from 0 to N−1. When N=4 and signal samples n run from 0 to 15, Hadamard input multiplier sequences 152 for the second ΔΣ channel 155, i=2, are:

$z_2(0) = C_2[0 \bmod 4] = C_2[0] = 1\ \ z_2(4) = z_2(8) = z_2(12) = z_2(0) = 1$ $z_2(1) = C_2[1 \bmod 4] = C_2[1] = -1\ \ z_2(5) = z_2(9) = z_2(13) = z_2(1) = -1$ $z_2(2) = C_2[2 \bmod 4] = C_2[2] = 1\ \ z_2(6) = z_2(10) = z_2(14) = z_2(2) = 1$ $z_2(3) = C_2[3 \bmod 4] = C_2[3] = -1\ \ z_2(7) = z_2(11) = z_2(15) = z_2(3) = -1$ Hadamard input multiplier sequences 152 for all N ΔΣ channels 155 when N=4 are shown in FIG. 13B. In each ΔΣ channel 155 i, sample n of signal 5A is multiplied by $z_i(n)$.

Figure 13C:
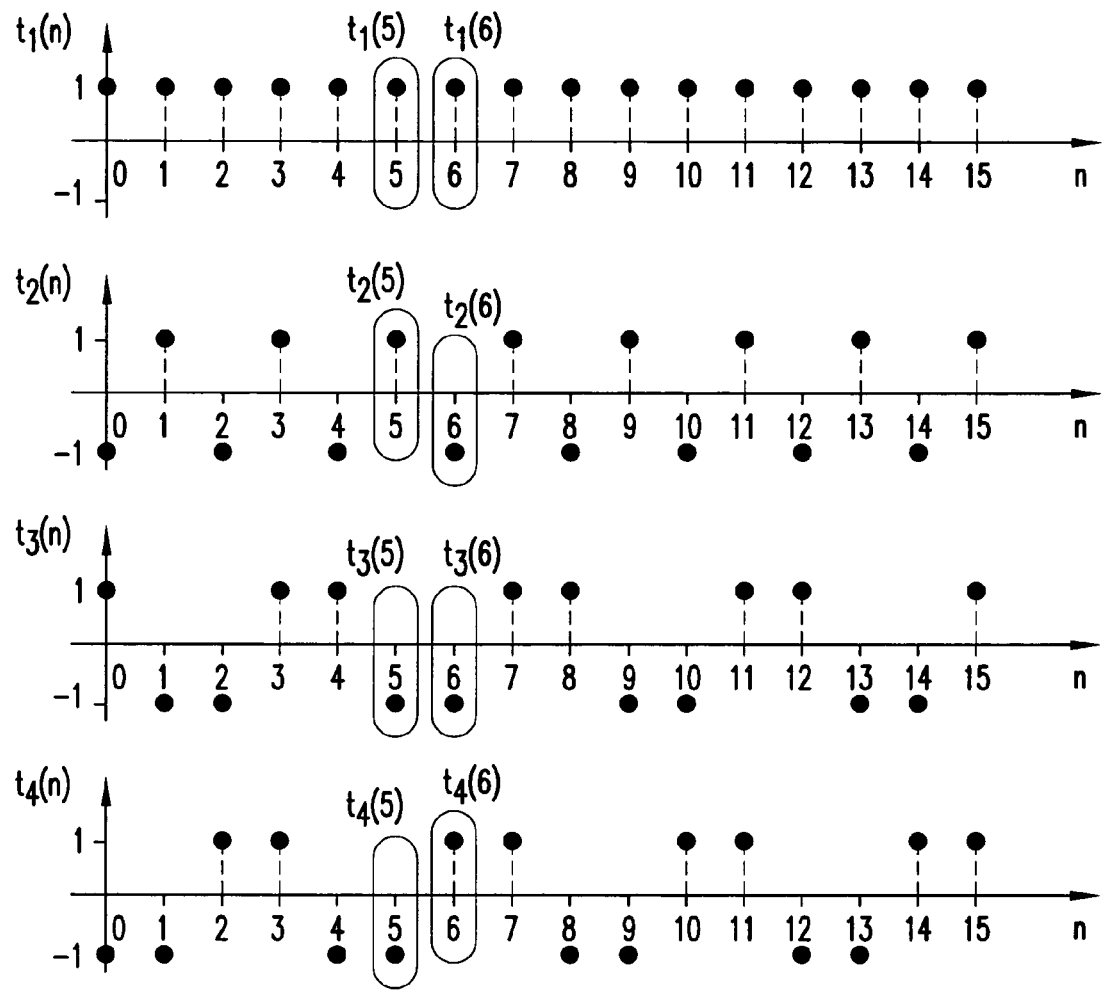
FIG. 13C illustrates an exemplary set of Hadamard output multiplier sequences that may be used by output multipliers in a delta sigma conversion unit, according to an embodiment of the present invention.

FIG. 13C illustrates a set of exemplary Hadamard output multiplier sequences 153 that may be used by output multipliers $240_i$ in a delta sigma conversion unit 501, for number N of ΔΣ channels $155_i$ in delta sigma conversion unit 50 with N=4, according to an embodiment of the present invention. The purpose of Hadamard output multiplier sequences 153 is to undo the frequency decomposing action of Hadamard input multiplier sequences 152. Within each ΔΣ channel 155, Hadamard output multiplier sequence 153 $t_i(n)$ is a delayed version of Hadamard input multiplier sequence 152 $z_i(n)$ to account for processing and signal delays between input multiplier 160 and output multiplier 240. For the specific case of Hadamard input multiplier sequences 152 in FIG. 13B, a set of Hadamard output multiplier sequences 153 $t_i(n)$ that may be used by output multipliers $240_i$ can be obtained from Hadamard codes 151 by the following formula:

$$t_i(n) = C_i[(n+1) \bmod N]$$

When N=4 and signal samples n run from 0 to 15, Hadamard output multiplier sequences 153 for the second ΔΣ channel 155, i=2, are:

$t_2(0) = C_2[1 \bmod 4] = C_2[1] = -1\ \ t_2(4) = t_2(8) = t_2(12) = t_2(0) = -1$ $t_2(1) = C_2[2 \bmod 4] = C_2[2] = 1\ \ t_2(5) = t_2(9) = t_2(13) = t_2(1) = 1$ $t_2(2) = C_2[3 \bmod 4] = C_2[3] = -1\ \ t_2(6) = t_2(10) = t_2(14) = t_2(2) = -1$ $t_2(3) = C_2[4 \bmod 4] = C_2[0] = 1\ \ t_2(7) = t_2(11) = t_2(15) = t_2(3) = 1$ Hadamard output multiplier sequences 153 for all ΔΣ channels 155 when N=4 are shown in FIG. 13C. In each ΔΣ channel 155 i, sample n of signal going into output multipliers 240 is multiplied by $t_i(n)$.

Figure 14A:
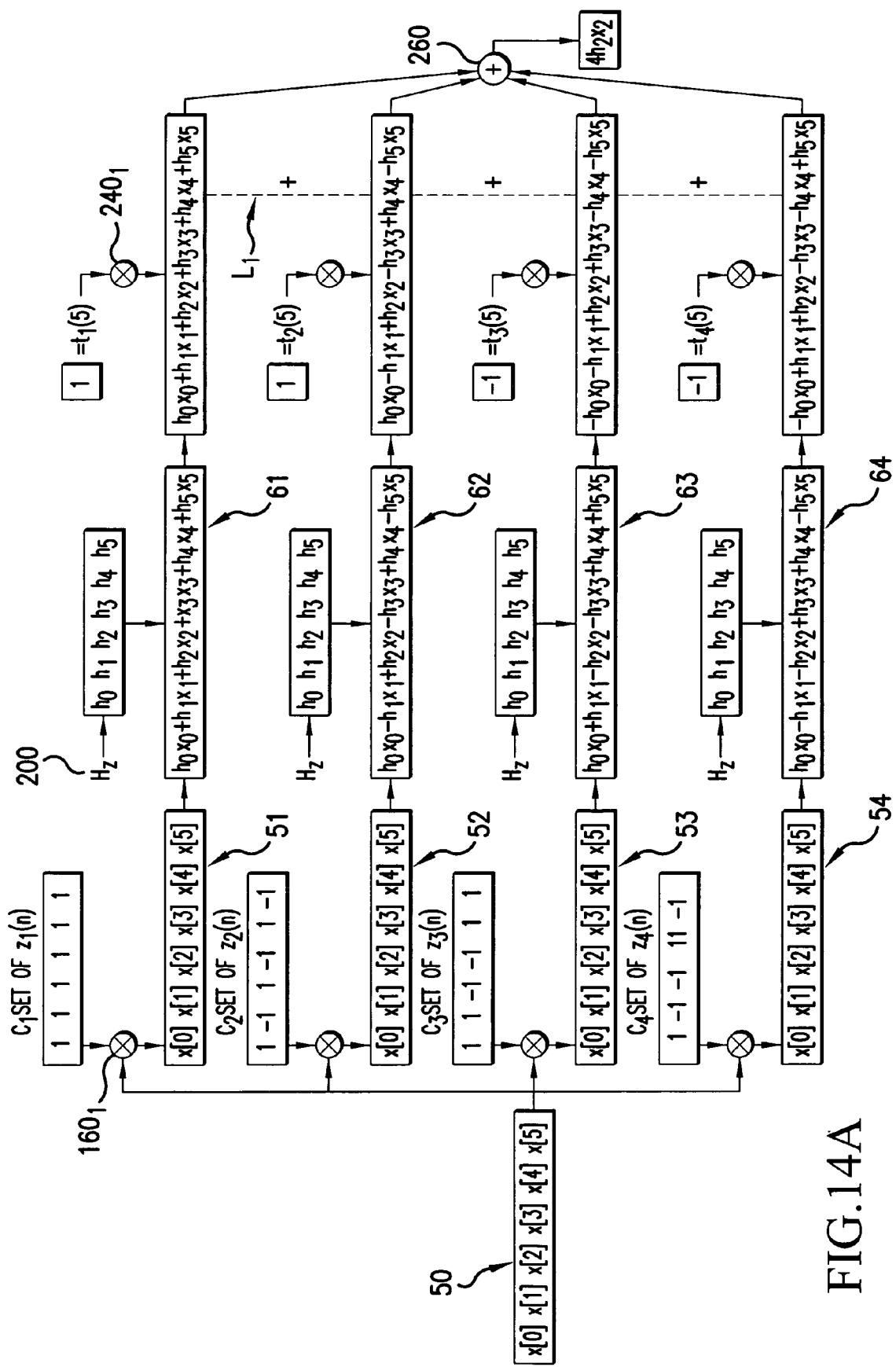
FIG. 14A and FIG. 14B illustrate aspects of the operation for obtaining the output of a signal passed through Hadamard input multipliers and Hadamard output multipliers in a delta sigma conversion unit, according to a particular example of an embodiment of the present invention.

FIG. 14A illustrates aspects of the operation for obtaining the output of a signal passed through Hadamard input multipliers $160_i$ and Hadamard output multipliers $240_i$ in a delta sigma conversion unit 501, according to a particular example of an embodiment of the present invention. For simplicity, the example uses a chain of Hadamard input multipliers 160 followed by Hadamard output multipliers 240, without the lowpass ΔΣ ADCs 180 in the middle. The length of identical H(z) digital correction filters 200 is chosen to be 6. The 6 samples from a signal 5A enter Hadamard input multipliers 160 S0=[x[0], x[1], x[2], x[3], x[4], x[5]]. Inside input multipliers 160, signal S0 is multiplied by corresponding Hadamard input multipliers sequences 152 labeled as C1 set, C2 set, C3 set, C4 set in FIG. 13B. Signals S1, S2, S3, S4 for channels 1,2,3 and 4 respectively, are output from input multipliers 160:

$S1 = [x[0]*z_1(0), x[1]*z_1(1), x[2]*z_1(2), x[3]*z_1(3), x[4]*z_1(4), x[5]*z_1(5)] = [x[0], x[1], x[2], x[3], x[4], x[5]];$ $S2 = [x[0]*z_2(0), x[1]*z_2(1), x[2]*z_2(2), x[3]*z_2(3), x[4]*z_2(4), x[5]*z_2(5)] = [x[0], -x[1], x[2], -x[3], x[4], -x[5]];$ and so on.

Signals S1, S2, S3 and S4 are sent to digital correction filters 200 or order 6. Each order 6 digital correction filter 200 is represented by filter functions [h(0),h(1),h(2),h(3),h(4),h(5)]. Signals G1, G2, G3, and G4 for channels 1,2,3 and 4 respectively, are output from digital correction filters 200:

$G1 = h(0)x[0] + h(1)x[1] + h(2)x[2] + h(3)x[3] + h(4)x[4] + h(5)x[5];$ $G2 = h(0)x[0] - h(1)x[1] + h(2)x[2] - h(3)x[3] + h(4)x[4] - h(5)x[5];$ and so on.

Signals G1, G2, G3 and G4 are then input into Hadamard output multipliers 240 where they are each multiplied by the Hadamard output multiplier sequences 153 corresponding to the order of the last sample input into the system, x[5]. The Hadamard output multiplier sequences 153 corresponding to the order of the last sample input into the system are labeled $t_1(5), t_2(5), t_3(5), t_4(5)$ in FIG. 5C. The output obtained from network adder 260 is sum $G1t_1(5)+G2t_2(5)+G3t_3(5)+G4t_4(5)$. As seen in FIG. 14A, the output is $4h(2)x[2]$.

Figure 14B:
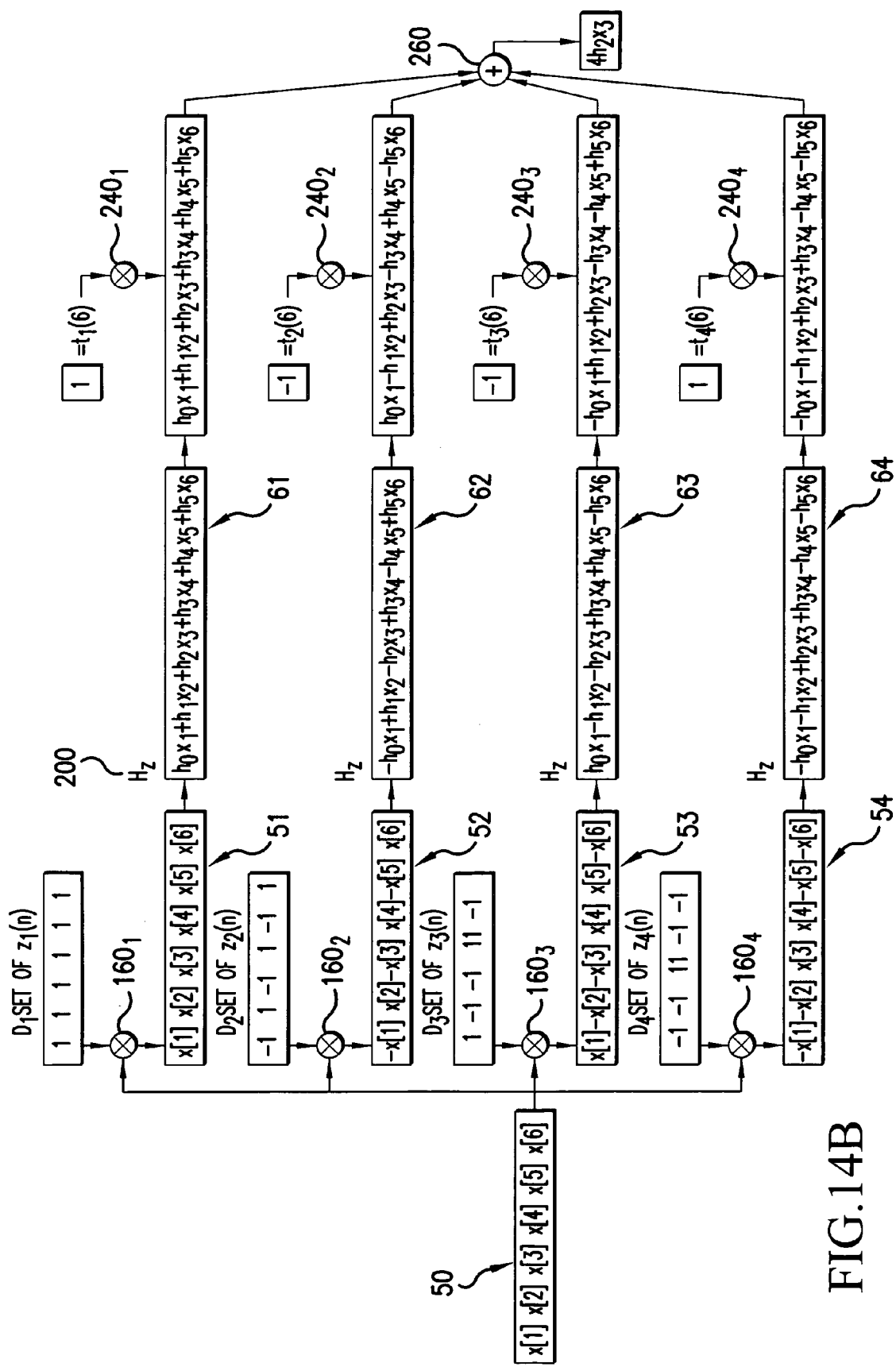

FIG. 14B illustrates aspects of the operation for obtaining the output of a signal passed through Hadamard input multipliers $160_i$ and Hadamard output multipliers 240 in a delta sigma conversion unit 501, according to a particular example of an embodiment of the present invention. The algorithm presented in FIG. 14A is repeated in FIG. 14B for the next time instant when the input is $S0=[x[1], x[2], x[3], x[4], x[5], x[6]]$. Within each channel, signal S0 is multiplied by corresponding Hadamard input multipliers sequences 152 labeled as D1 set, D2 set, D3 set, D4 set in FIG. 13B, sent to digital correction filters 200, multiplied by the Hadamard output multiplier sequences 153 $t_1(6), t_2(6), t_3(6), t_4(6)$ from FIG. 5C corresponding to the order of the last sample input into the system, x[6], and added back in network adder 260. The result is $4h(2)x[3]$. Therefore the output signal of network adder 260 is simply a delayed and scaled version of the input signal.

The parallel, adaptive delta sigma ADC 100 is compatible with high speed, BiCMOS mixed signal processes, SiGe processes, and monolithic integration, as well as ASIC implementation. The filtering operations inside parallel, adaptive ADC 100 are linear, and therefore can be interchanged and/or combined.

Although detailed embodiments and implementations of the present invention have been described above, it should be apparent that various modifications are possible without departing from the spirit and scope of the present invention.

We claim:

1. An apparatus for adaptive analog-to-digital conversion, said apparatus comprising:

a frequency modulator unit for changing an input analog signal into a modulated analog signal with a frequency spectrum in a bandwidth of interest;

a parallel self-adapting delta sigma analog to digital signal conversion unit operatively connected to said frequency modulator unit, said parallel self-adapting delta sigma conversion unit operating in response to a control signal from a controller for converting said modulated analog signal into a digital signal said self-adapting delta signal conversion unit including a code generator controlled by said controller and a plurality of substantially like self-adapting delta sigma channels connected in parallel between said frequency modulation and a digital signal adder unit, said digital signal adder unit providing a digital output signal;

said controller being operatively connected to said frequency modulator unit and said plurality of parallel self-adapting delta-sigma signal channels of said delta sigma conversion unit, and being operable for adjusting at least one parameter relating to a frequency characteristic of said frequency modulator unit and/or said plurality of parallel self-adapting delta sigma channels of said delta sigma conversion unit.

2. The apparatus according to claim 1, said frequency modulator unit including a tunable bandpass filter operatively connected to said control unit, said tunable bandpass filter receiving the input analog signal, wherein the at least one parameter includes a predetermined number of frequency segments, a center frequency and/or a bandwidth of the tunable bandpass filter, said controller controlling a filter response of said tunable bandpass filter to obtain the modulated analog signal with the frequency spectrum in the bandwidth of interest.

3. The apparatus according to claim 2, said frequency modulator unit further including a mixer operatively connected to said tunable bandpass filter and a tunable local oscillator operatively connected to said mixer and to said controller, said mixer receiving the input analog signal and multiplying the input analog and a frequency signal from said tunable local oscillator to obtain a signal of intermediate frequency, wherein the at least one parameter includes a center frequency of the tunable local oscillator, said controller controlling a frequency of said tunable local oscillator to obtain the modulated analog signal with the intermediate frequency in the bandwidth of interest.

4. The apparatus according to claim 1, including:

an analog signal splitter operatively connected to said frequency modulator unit, said signal splitter splitting the modulated analog signal into a plurality of channel signals;

and wherein each said self-adapting delta sigma channel includes, an input multiplier operatively connected to said splitter for converting the modulated analog signal to a coded samples in each channel using a set of codes;

a lowpass delta sigma analog-to-digital converter operatively connected to said input multiplier, said lowpass delta sigma analog-to-digital converter converting said coded sample to digital coded sample;

an adaptable digital correction filter operatively connected to said delta sigma converter for digitally filtering the digital coded sample;

a programmable decimation filter operatively connected to said adaptable digital correction filter, said decimation filter decimating the filtered digital coded sample from said adaptable digital correction filter; and an output multipliers operatively connected to said decimation filter, said output multiplier converting the decimated digital coded sample to a digital uncoded sample using said set of codes from said code generator.

5. The apparatus according to claim 4, wherein the at least one parameter includes a code length and/or a type of code for the set of codes, said code generator being operatively connected to all of said input multipliers and to all of said output multipliers, said code generator supplying the set of codes to said input multipliers and to said output multipliers, said controller adjusting the code length and/or type of code for the set of codes.

6. The apparatus according to claim 5, wherein said controller controls a code calculator generator that generates said set of codes using calculations according to the code length and/or type of code.

7. The apparatus according to claim 5, wherein said controller controls the code generator for generating a predetermined code length and/or type of code, said code generator including a memory containing one or more lookup tables with one or more sets of codes.

8. The apparatus according to claim 7, wherein said controller adjusting the code length of said set of codes generated by said code generator by reading from different lookup tables or by changing a readout rate of a single lookup table.

9. The apparatus according to claim 5, wherein said set of codes contains 1s and/or −1s.

10. The apparatus according to claim 9, wherein said set of codes are Hadamard codes.

11. The apparatus according to claim 4, wherein each filter of said programmable decimation filters is operatively connected to and controlled by said controller, wherein the at least one parameter includes adjusting a filter function, cutoff frequency and/or filter length of said programmable decimation filter, said controller adjusting a filter function, cutoff frequency and/or filter length of said programmable decimation filter so as to adapt said programmable decimation filter.

12. The apparatus according to claim 4, wherein each of said input multipliers and/or each of said output multipliers use current steering bipolar switches in emitter-follower unity gain buffers.

13. The apparatus according to claim 4, wherein said adaptable digital correction filter is operatively connected to said controller, said controller adjusting a frequency characteristic said digital correction filter to correct for inaccuracies introduced by said lowpass delta sigma analog-to-digital converter connected thereto.

14. The apparatus according to claim 1, wherein each of said delta sigma channels of said plurality of self-adapting delta sigma channels includes a series circuit comprising an analog input frequency multiplier, a lowpass delta sigma analog to digital signal converter, an adaptable digital signal correction filter, a programmable decimation filter, and an output signal multiplier.

15. An apparatus for adaptive analog-to-digital conversion, said apparatus comprising:

a frequency modulator unit including a tunable bandpass filter for changing an input analog signal into a modulated analog signal with a frequency spectrum in a bandwidth of interest;

a parallel delta sigma conversion unit operatively connected to said frequency modulator unit, said parallel delta sigma conversion unit converting said modulated analog signal into a digital signal;

said parallel delta sigma conversion unit including:

a plurality of input multipliers operatively connected in parallel, each receiving the modulated analog signal and converting the modulated analog signal to coded samples using a set of codes;

a plurality of lowpass delta sigma analog-to-digital converters operatively connected in parallel and to said input multipliers, said plurality of lowpass delta sigma analog-to-digital converters converting said coded samples to digital coded samples;

a plurality of tunable decimation filters operatively connected in parallel and to said lowpass delta sigma analog-to-digital converters, said decimation filters decimating the digital coded samples; and a plurality of output multipliers operatively connected in parallel and to said decimation filters, said output multipliers converting the decimated digital coded samples to digital uncoded samples using said set of codes;

a controller operatively connected to said tunable bandpass filter, said input multipliers, and said output multipliers, said controller controlling a frequency response of said tunable bandpass filter and controlling said set of codes in order to change a bandwidth and/or dynamic range of the apparatus.

16. The apparatus according to claim 15, said controller controlling a number of frequency segments, a center frequency and/or a bandwidth of the tunable bandpass filter.

17. The apparatus according to claim 15, said controller controlling the code length and/or type of code for the set of codes.

18. The apparatus according to claim 15, said frequency modulator unit further including a mixer operatively connected to said tunable bandpass filter and a tunable local oscillator operatively connected to said mixer and to said controller, said mixer receiving the input analog signal and multiplying the input analog and a frequency signal from said tunable local oscillator to obtain a signal of intermediate frequency, said controller controlling a frequency of said tunable local oscillator to obtain the modulated analog signal with the intermediate frequency in a bandwidth of interest.

19. The apparatus according to claim 15, wherein said set of codes are Hadamard codes.

* * * * *